US011855046B2

(12) United States Patent
Yu et al.

(10) Patent No.: US 11,855,046 B2
(45) Date of Patent: Dec. 26, 2023

(54) MEMORY PACKAGES AND METHODS OF FORMING SAME

(71) Applicant: Taiwan Semiconductor Manufacturing Company, Ltd., Hsinchu (TW)

(72) Inventors: Chen-Hua Yu, Hsinchu (TW); Chung-Hao Tsai, Huatan Township (TW); Chuei-Tang Wang, Taichung (TW); Yih Wang, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 17/655,602

(22) Filed: Mar. 21, 2022

(65) Prior Publication Data
US 2022/0208735 A1    Jun. 30, 2022

Related U.S. Application Data

(62) Division of application No. 16/745,718, filed on Jan. 17, 2020, now Pat. No. 11,282,816.

(51) Int. Cl.
*H01L 25/065* (2023.01)
*H01L 23/00* (2006.01)
(Continued)

(52) U.S. Cl.
CPC ...... *H01L 25/0657* (2013.01); *H01L 23/3107* (2013.01); *H01L 23/481* (2013.01);
(Continued)

(58) Field of Classification Search
CPC . H01L 25/0657; H01L 25/18; H01L 23/3107; H01L 23/481; H01L 23/5283; H01L 24/05; H01L 24/19; H01L 24/20; H01L 24/82; H01L 24/03; H01L 27/222; H01L 27/10814; H01L 27/10847; H01L 27/10897; H01L 27/108; H01L 27/11;
(Continued)

(56) References Cited

U.S. PATENT DOCUMENTS

2016/0035711 A1    2/2016  Hu
2017/0133351 A1*   5/2017  Su ...................... H01L 23/5389
(Continued)

*Primary Examiner* — Kyoung Lee
*Assistant Examiner* — Christina A Sylvia
(74) *Attorney, Agent, or Firm* — Slater Matsil, LLP

(57) ABSTRACT

A package includes a memory stack attached to a logic device, the memory stack including first memory structures, a first redistribution layer over and electrically connected to the first memory structures, second memory structures on the first redistribution layer, a second redistribution layer over and electrically connected to the second memory structures, and first metal pillars on the first redistribution layer and adjacent the second memory structures, the first metal pillars electrically connecting the first redistribution layer and the second redistribution layer, wherein each first memory structure of the first memory structures includes a memory die comprising first contact pads and a peripheral circuitry die comprising second contact pads, wherein the first contact pads of the memory die are bonded to the second contact pads of the peripheral circuitry die.

20 Claims, 31 Drawing Sheets

(51) Int. Cl.
   *H01L 23/528* (2006.01)
   *H01L 23/31* (2006.01)
   *H01L 23/48* (2006.01)
   *H10B 12/00* (2023.01)
   *H10N 50/01* (2023.01)
   *H10N 50/80* (2023.01)

(52) U.S. Cl.
   CPC .......... *H01L 23/5283* (2013.01); *H01L 24/05* (2013.01); *H01L 24/19* (2013.01); *H01L 24/20* (2013.01); *H01L 24/82* (2013.01); *H10B 12/02* (2023.02); *H10B 12/315* (2023.02); *H10B 12/50* (2023.02); *H10N 50/01* (2023.02); *H10N 50/80* (2023.02); *H01L 2924/1431* (2013.01); *H01L 2924/1436* (2013.01)

(58) Field of Classification Search
   CPC . H01L 43/02; H01L 43/12; H01L 2924/1431; H01L 2924/1436; H01L 2924/08145; H01L 2224/0231
   See application file for complete search history.

(56) References Cited

U.S. PATENT DOCUMENTS

| | | |
|---|---|---|
| 2018/0138101 A1 | 5/2018 | Yu et al. |
| 2018/0294212 A1* | 10/2018 | Chen .................... H01L 21/481 |
| 2019/0244905 A1 | 8/2019 | Yu et al. |
| 2020/0083187 A1 | 3/2020 | Wu et al. |
| 2021/0118858 A1 | 4/2021 | Yu et al. |

\* cited by examiner

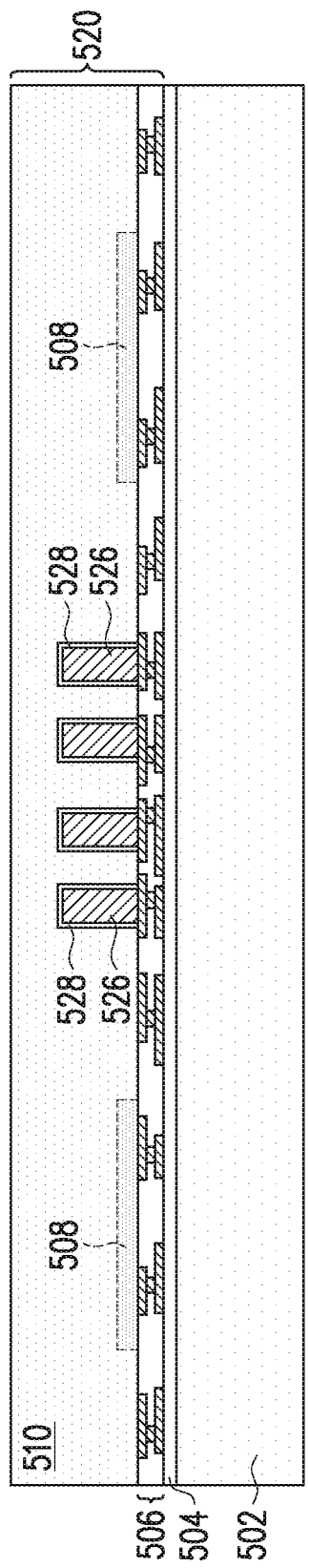
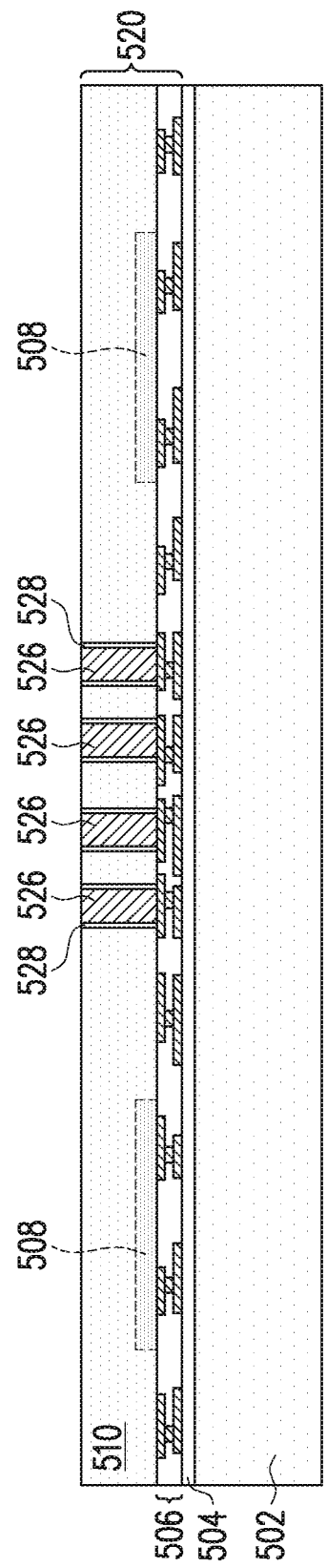
FIG. 5A
FIG. 5B

MEMORY PACKAGES AND METHODS OF FORMING SAME

PRIORITY CLAIM AND CROSS-REFERENCE

This application is a divisional of U.S. patent application Ser. No. 16/745,718, filed on Jan. 17, 2020, now U.S. Pat. No. 11,282,816, issued on Mar. 22, 2022, which application is hereby incorporated herein by reference.

BACKGROUND

A High-Performance Computing (HPC) system often includes a High-Bandwidth-Memory (HBM) stack bonded to a logic die. A HBM stack typically includes a plurality of memory dies stacked together, with higher memory dies bonded to the lower memory dies through solder bonding or metal direct bonding through micro bumps. Through-Silicon Vias (TSVs) are formed in the memory dies, so that upper dies may be electrically connected to the logic die through the TSVs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 5A through 5E are cross-sectional views of intermediate steps during a process for forming a memory package, in accordance with some embodiments.

DETAILED DESCRIPTION

Figure 1:
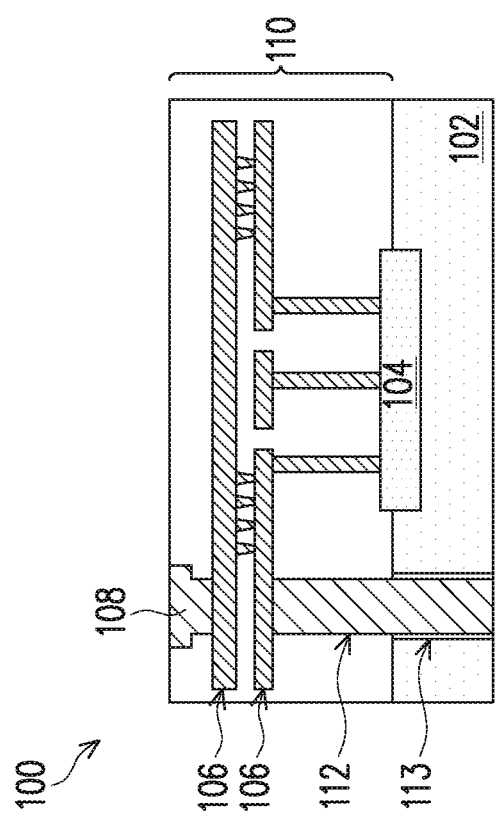
FIG. 1 illustrates a cross-sectional view of a peripheral device of a memory structure, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Memory packages including a stack of memory structures and methods of forming the same are provided in accordance with various embodiments. The intermediate stages in the formation of the memory stack are illustrated in accordance with some embodiments. Some variations of some embodiments are discussed. Throughout the various views and illustrative embodiments, like reference numbers are used to designate like elements. In accordance with some embodiments of the present disclosure, a memory structure includes a memory device (e.g., a memory die) that is bonded to a peripheral device (e.g., another die). The memory device may be hybrid-bonded to the peripheral device, for example. By bonding the peripheral device to the memory device, the distances of the electrical routing between the peripheral device and the memory device may be reduced, which can reduce latency and improve operation speed. Additionally, the memory devices and peripheral devices may be separately formed using different technologies or processes.

It is appreciated that embodiments will be described with respect to a specific context, namely a die stack including memory dies bonded to a device die. The concept of the discussed embodiments may also be applied to the structure and the processing of other structures including, and not limited to, the formation of logic die stacks, I/O die stacks, or a die stack including mixed logic die(s), I/O die(s), memory die(s), and the like. Embodiments discussed herein are to provide examples to enable making or using the subject matter of this disclosure, and a person having ordinary skill in the art will readily understand modifications that can be made while remaining within contemplated scopes of different embodiments. Like reference numbers and characters in the figures below refer to like components. Although method embodiments may be discussed as being performed in a particular order, other method embodiments may be performed in any logical order.

FIGS. 1, 2, and 3A-F illustrate cross-sectional views of intermediate stages in the formation of a memory structure 300 in accordance with some embodiments of the present disclosure. FIG. 1 illustrates a peripheral device 100 in accordance with some embodiments, and FIGS. 2A and 2B illustrate a memory devices 200 in accordance with some embodiments. FIGS. 3A-F illustrates the formation of the memory structure 300 from the peripheral device 100 and the memory device 200. A memory structure 300 may be formed using other techniques or process stages than shown. The peripheral device 100, memory device 200, and memory structure 300 shown are illustrative examples, and other embodiments may have other configurations or features than shown without deviating from the scope of the present disclosure. For example, some memory structures having different configurations are shown in the embodiments illustrated in FIGS. 6 through 8.

FIG. 1 shows the peripheral device 100, in accordance with some embodiments. Peripheral device 100 may be, for example, an integrated circuit die, chip, package, or other device that interfaces with the memory device 200. The peripheral device 100 may, for example, include logic circuits, control circuits, I/O circuits, testing circuits, or the like that communicate with or control operation of the memory device 200 in the memory structure 300. The peripheral device 100 shown in FIG. 1 may be formed, for example, in a wafer, which may include different device regions that are singulated in subsequent steps to form a plurality of peripheral devices. Peripheral device 100 may be processed according to applicable manufacturing processes to form peripheral devices. For example, peripheral device 100 includes a semiconductor substrate 102, which may comprise a material such as silicon, doped or undoped, or an active layer of a semiconductor-on-insulator (SOI) substrate. The semiconductor substrate 102 may include other semiconductor materials, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. The semiconductor substrate 102 has an active surface (e.g., the surface facing upwards in FIG. 1), sometimes called a front side, and an inactive surface (e.g., the surface facing downwards in FIG. 1), sometimes called a back side.

Devices 104 may be formed at the front surface of the semiconductor substrate 102. Devices 104 may comprise active devices (e.g., transistors, diodes, etc.), and/or passive devices (e.g., capacitors, resistors, etc.). An interconnect structure 110 is formed over substrate 102 and devices 104, and may include dielectric layers, metallization patterns 106 (e.g., metal lines, vias, etc.), and the like. The dielectric layers may include low-k dielectric layers and/or non-low-k dielectric layers. In some embodiments, one or more dielectric layers of interconnect structure 110 are formed of silicon oxide, silicon nitride, silicon carbide, silicon oxynitride, combinations thereof, and/or multi-layers thereof. Metallization patterns 106 of interconnect structure 110 are electrically coupled to the devices 104 to form peripheral device 100. Metallization patterns 106 may be formed of tungsten, cobalt, nickel, copper, silver, gold, aluminum, the like, or combinations thereof. Metallization patterns 106 may be formed using a suitable process, such as a dual damascene process or another process.

In some embodiments, peripheral device 100 includes through-vias (sometimes referred to as Through-Substrate Vias (TSVs)) 112 that extend through semiconductor substrate 102 and into interconnect structure 110. For example, TSVs 112 may extend through semiconductor substrate 102 and electrically connect to a metallization pattern 106 of interconnect structure 110. In some embodiments, one or more TSVs 112 may extend through interconnect structure 110 and electrically connect to a contact pad 108 (described below) of interconnect structure 110. The TSV 112 may be surrounded by a liner 113. One TSV 112 is shown in FIG. 1, but more than one TSV 112 may be present in other embodiments. In other embodiments, peripheral device 100 does not include TSVs 112.

The peripheral device 100 further includes bond pads 108 formed in interconnect structure 110. Bond pads 108 may be formed of a metal that facilitates hybrid bonding, such as copper, a copper alloy, or another suitable metal. Bond pads 108 are electrically connected to a metallization pattern 106 and/or a TSV 112, or bond pads 108 may be part of a metallization pattern 106. Bond pads 108 may be coplanar with a top surface of interconnect structure 110. The top surface of interconnect structure 110 may be a dielectric material such as silicon oxide. One bond pad 108 is shown in FIG. 1, but more than one bond pad 108 may be present in other embodiments.

Figure 2A:
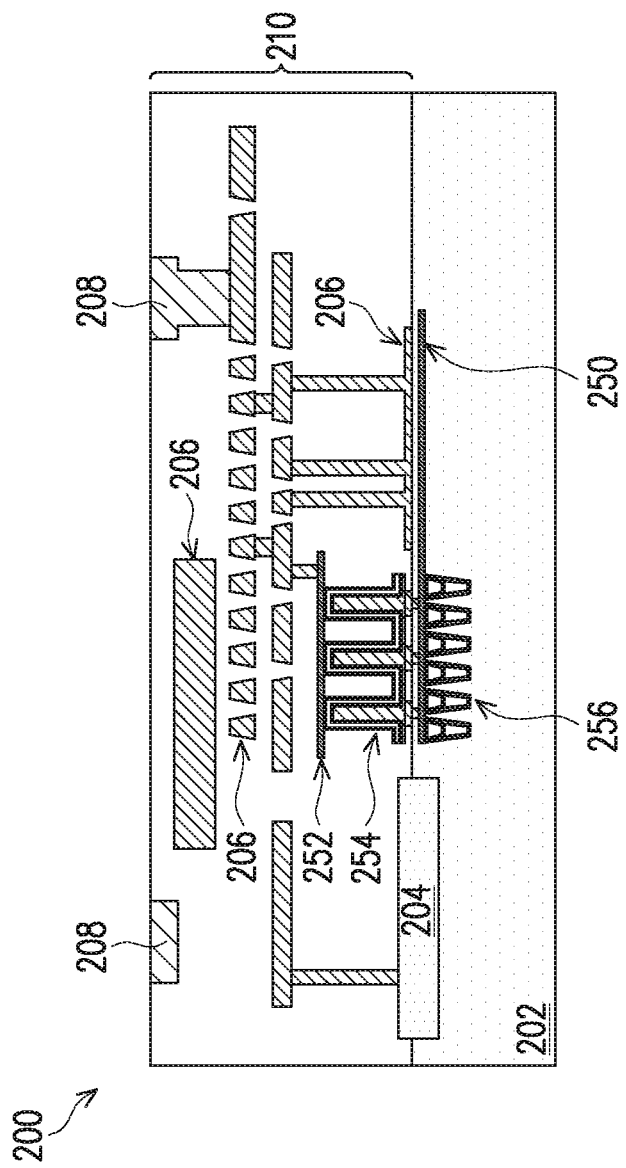
FIGS. 2A and 2B illustrates a cross-sectional view of a memory device of a memory structure, in accordance with some embodiments.
Figure 2B:
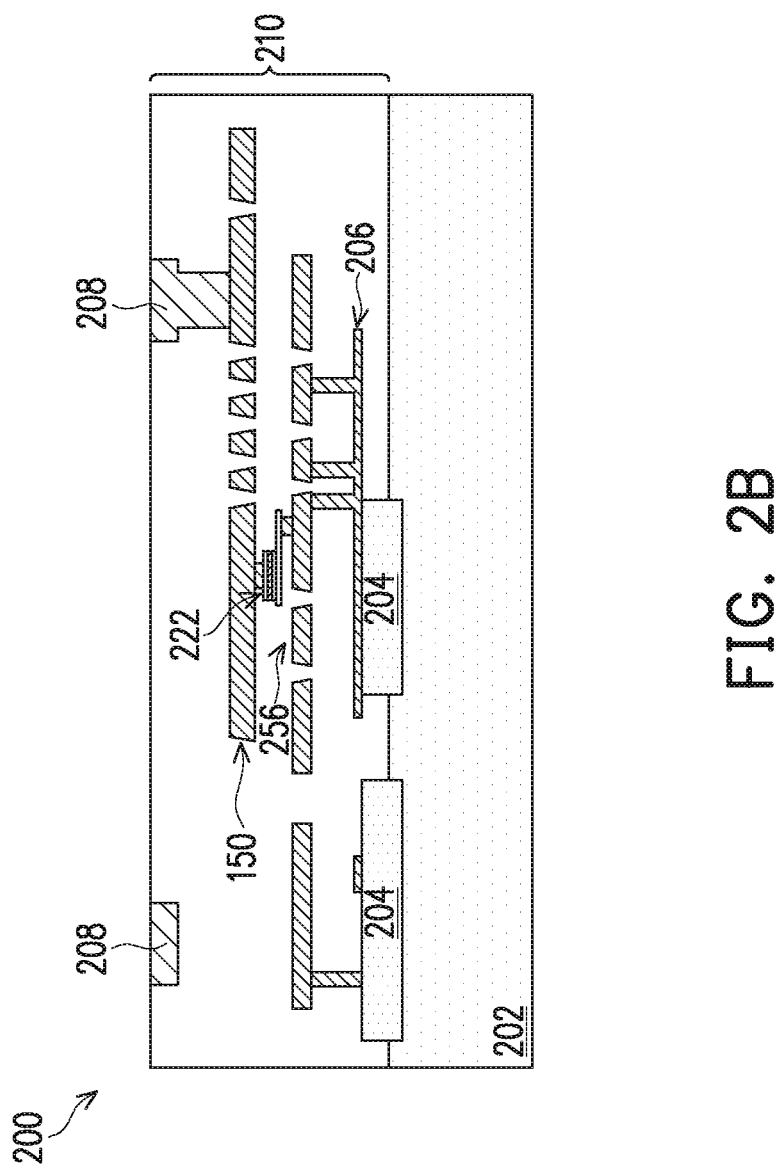

Turning to FIGS. 2A and 2B, two embodiments of a memory device 200 are shown. The memory device 200 may comprise different types of memory technology, such as Dynamic Random Access Memory (DRAM), Static Random Access Memory (SRAM), Magnetic Random Access Memory (MRAM), or other types of memory technology. For example, FIG. 2A shows a memory device 200 comprising DRAM, and FIG. 2B shows a memory device 200 comprising MRAM. Memory device 200 may include a substrate 202 and devices 204 formed at the front surface of the substrate 202. In some embodiments, memory device 200 may be a memory die, an integrated circuit die comprising memory components, or the like. Devices 204 may comprise active devices (e.g., transistors, diodes, etc.), and/or passive devices (e.g., capacitors, resistors, etc.). Memory devices using different types of memory technology may include different memory components. For example, memory components of the DRAM memory device 200 shown in FIG. 2A include stack capacitors 254 connected to a top metal contact 252 and a bottom contact metal 250, in accordance with some embodiments. In accordance with some embodiments, bottom contact metal 250 is used as a bit-line. In some embodiments, word-lines 256 may be formed in substrate 202. As another example, memory components of the MRAM memory device 200 shown in FIG. 2B include a magnetic tunnel junction (MTJ) 222 connected to a word-line 256 and a bit-line 250, in accordance with some embodiments. In some embodiments, the word-lines 256 or the bit-lines 250 of the MRAM memory device 200 may be metallization patterns 206 of the interconnect structure 210, described below. The memory devices 200 shown in FIGS. 2A and 2B are illustrative examples, and other types or configurations of memory devices 200 are possible.

An interconnect structure 210 is formed over substrate 202 and devices 204, and may include dielectric layers, metallization patterns 206 (e.g., metal lines, vias, etc.), and the like. Components of the memory (e.g., the stack capacitors 254 or other components) may be formed within the interconnect structure 210, in some embodiments. The dielectric layers may include low-k dielectric layers and/or non-low-k dielectric layers. In some embodiments, one or more dielectric layers of interconnect structure 210 are formed of silicon oxide, silicon nitride, silicon carbide, silicon oxynitride, combinations thereof, and/or multi-layers thereof. Metallization patterns 206 of interconnect structure 210 are electrically coupled to the devices 204 and the memory components to form memory device 200. Metallization patterns 206 may be formed of tungsten, cobalt, nickel, copper, silver, gold, aluminum, the like, or combinations thereof. Metallization patterns 206 may be formed using a suitable process, such as a dual damascene process or another process.

The memory device 200 further includes bond pads 208 formed in interconnect structure 210. Bond pads 208 may be formed of a metal that facilitates hybrid bonding, such as copper, a copper alloy, or another suitable metal. Bond pads 208 are electrically connected to metallization pattern 206, or bond pads 208 may be part of the metallization pattern 206. Bond pads 208 may be coplanar with a top surface of interconnect structure 210. The top surface of interconnect structure 210 may be a dielectric material such as silicon oxide. Two bond pads 208 are shown in FIG. 2, but one bond pad 208 or more than two bond pads 208 may be present in other embodiments.

Figure 3A:
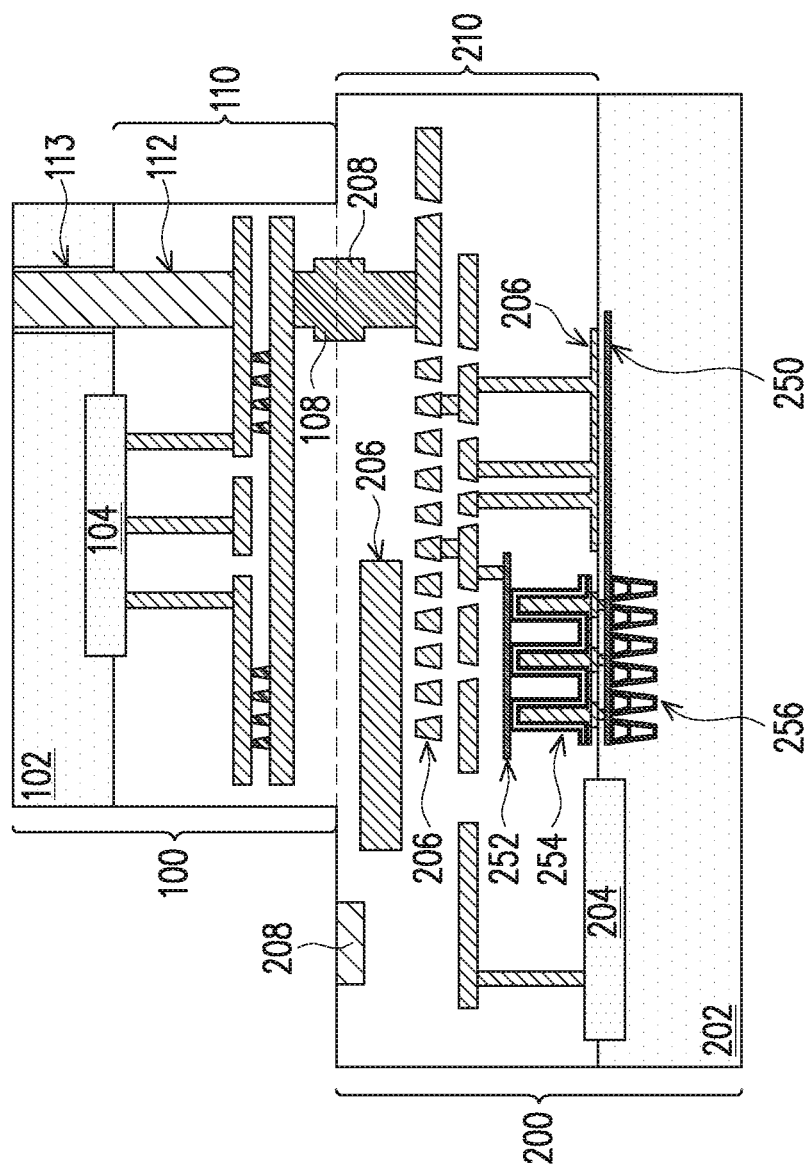
FIGS. 3A through 3F illustrate the cross-sectional views of intermediate stages in the formation of a memory structure, in accordance with some embodiments.

FIGS. 3A through 3F are cross-sectional views of intermediate steps during a process for forming a memory structure 300 (see FIG. 3E), in accordance with some embodiments. The process shown in FIGS. 3A-F is an illustrative example, and may, for example, illustrate the formation of a complete memory structure 300, a portion of a complete memory structure 300, or one of several memory structures 300 that are subsequently singulated. Other configurations of a memory structure 300 are considered within the scope of this disclosure. In FIG. 3A, a peripheral device 100 is bonded to a memory device 200. The bonded portions of the peripheral device 100 and the memory device 200 are indicated by a dashed line in FIGS. 3A-F.

In some embodiments, the peripheral device 100 may be bonded to the memory device 200 using, for example, a hybrid bonding technique. For example, one or more bond pads 108 of peripheral device 100 may be bonded to bond pads 208 of memory device 200, and the top surface of interconnect structure 110 of peripheral device 100 may be bonded to the top surface of the interconnect structure 210 of memory device 200. Before performing the bonding, a surface treatment may be performed on the peripheral device 100 and/or the memory device 200. The surface treatment may be, for example, a plasma treatment process, and the process gas used for generating the plasma may be a hydrogen-containing gas, which includes a first gas including hydrogen ($H_2$) and argon (Ar), a second gas including $H_2$ and nitrogen ($N_2$), or a third gas including $H_2$ and helium (He). Through the treatment, the number of OH groups at the surfaces of the peripheral device 100 and the memory device 200 may be increased. Next, a pre-bonding process may be performed, in which the peripheral device 100 and the memory device 200 are aligned. The peripheral device 100 and the memory device 200 are pressed against together to form weak bonds between the top surface of the interconnect structure 110 of peripheral device 100 and the top surface of the interconnect structure 210 of memory device 200. After the pre-bonding process, an anneal is performed to strengthen the weak bonds and form a fusion bond. During the annealing, the H of the OH bonds is outgassed, thereby forming Si—O—Si bonds between the interconnect structure 110 and the interconnect structure 210, thereby strengthening the bonds. During the hybrid bonding, direct metal-to-metal bonding also occurs between the bond pads 108 of peripheral device 100 and the bond pads 208 of memory device 200. Accordingly, the resulting bond is a hybrid bond that includes the Si—O—Si bond and metal-to-metal direct bond.

By bonding the peripheral device 100 to the memory device 200, the routing distance between the peripheral device 100 and the memory device 200 may be reduced, which can decrease latency and improve high-frequency operation. For example, the routing distance may be reduced compared with forming the devices 104 of the peripheral device 100 on the same substrate 202 as the memory device 200. In some embodiments, the process techniques used to form the peripheral device 100 may be different from the process techniques used to form the memory device 200. For example, a process for forming CMOS ("a CMOS process") may be used to form the peripheral device 100 and a process for forming DRAM ("a DRAM process") may be used to form the memory device 200. This is an example, and other types of processes may be used in other embodiments. In this manner, particular process techniques may be used to optimize the formation or configuration of the peripheral device 100 and different particular process techniques may be used to optimize the formation or configuration of the memory device 200. By forming different the peripheral devices 100 and the memory devices 200 using appropriate processes, a memory structure 300 may be formed having improved performance.

In some embodiments, more than one peripheral device 100 may be bonded to the memory device 200, and the more than one peripheral devices 100 may include similar and/or different peripheral devices. In some embodiments, the length or width of the peripheral device 100 may be less than the corresponding length or width of the memory device 200, as shown in FIG. 3A. In some embodiments, a peripheral device 100 may have a length or width that is between about 12 mm and about 3 mm, and a memory device 200 may have a length or width that is between about 15 mm and about 5 mm. In some embodiments, the peripheral device 100 may have a length or width that is between about 30% and about 100% of the corresponding length or width of the memory device 200. In some embodiments, a peripheral device 100 may have an area that is between about 9 mm$^2$ and about 144 mm$^2$, and a memory device 200 may have an area that is between about 25 mm$^2$ and about 225 mm$^2$. In this manner, devices of many sizes and shapes may be combined in various arrangements to form a memory structure 300, which allows for a large flexibility of design, e.g., for a particular application.

Figure 3B:
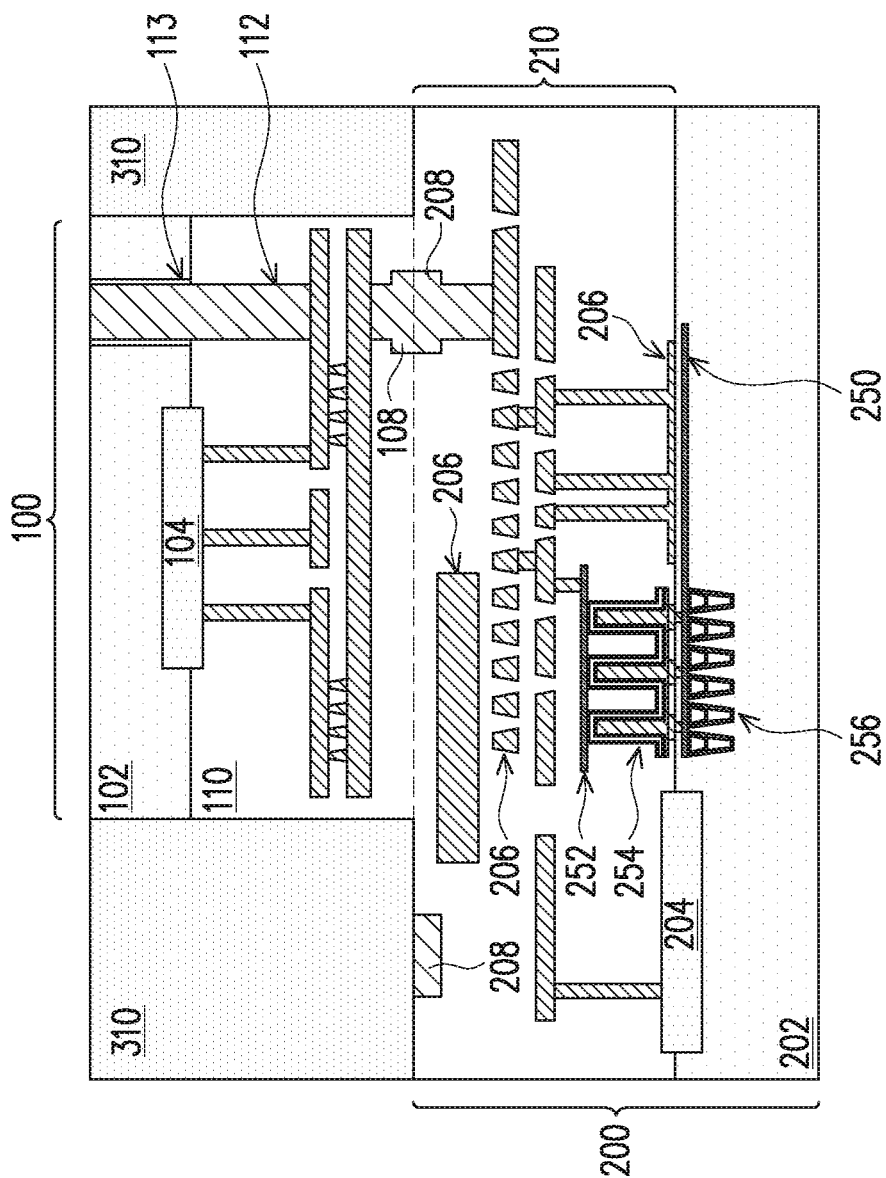

Turning to FIG. 3B, a dielectric material 310 is formed over the peripheral device 100 and the memory device 200, in accordance with some embodiments. In some embodiments, dielectric material 310 comprises an oxide such as a silicon oxide, which may be formed, for example, using tetraethyl orthosilicate (TEOS) or another technique. Dielectric material 310 may be formed using, for example, Chemical Vapor Deposition (CVD), High-Density Plasma Chemical Vapor Deposition (HDPCVD), or the like. In accordance with other embodiments, dielectric material 310 is formed of a polymer such as PBO, polyimide, or the like. A planarization process may be performed to remove excess portions of dielectric material 310 such that the peripheral device 100 is exposed, which may expose the TSVs 112 of the peripheral device 100. The planarization process may comprise a grinding process, a chemical-mechanical polish (CMP) process, or the like.

Figure 3C:
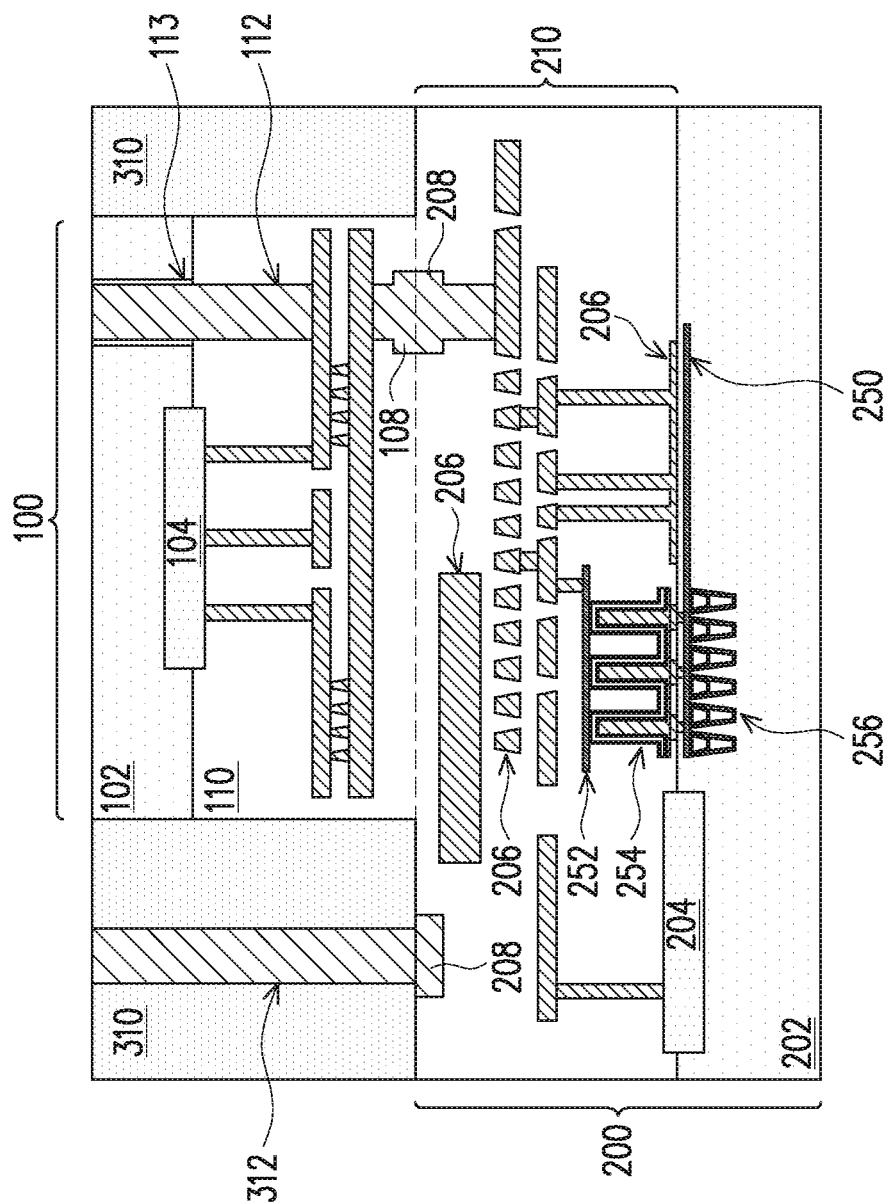

FIG. 3C illustrates the formation of Through-Dielectric Vias (TDVs) 312, which extend through dielectric material 310 and form electrical connection with memory device 200. TDVs 312 may be formed by etching through dielectric material 310 to form via openings, and then filling the via openings with conductive material. The etching may include, for example, an anisotropic dry etching process. In some embodiments, the etching exposes bond pads 208. In some embodiments, the etching may be performed using bond pads 208 as etch stop layers. In some embodiments, TDVs 312 are formed of a homogenous conductive material, which may comprise a metal or a metal alloy including copper, aluminum, tungsten, or the like. In accordance with other embodiments of the present disclosure, TDVs 312 comprise a composite structure including a conductive barrier layer formed of titanium, titanium nitride, tantalum, tantalum nitride, or the like, and a metal-containing material over the barrier layer. The formation of TDVs 312 may include depositing the conductive material into the via openings and then performing a planarization process to remove excess portions of the deposited conductive material over dielectric material 310 and peripheral device 100. One TDV 312 is shown in FIGS. 3C-E, but more than one TDV 312 may be present in other embodiments.

Figure 3D:
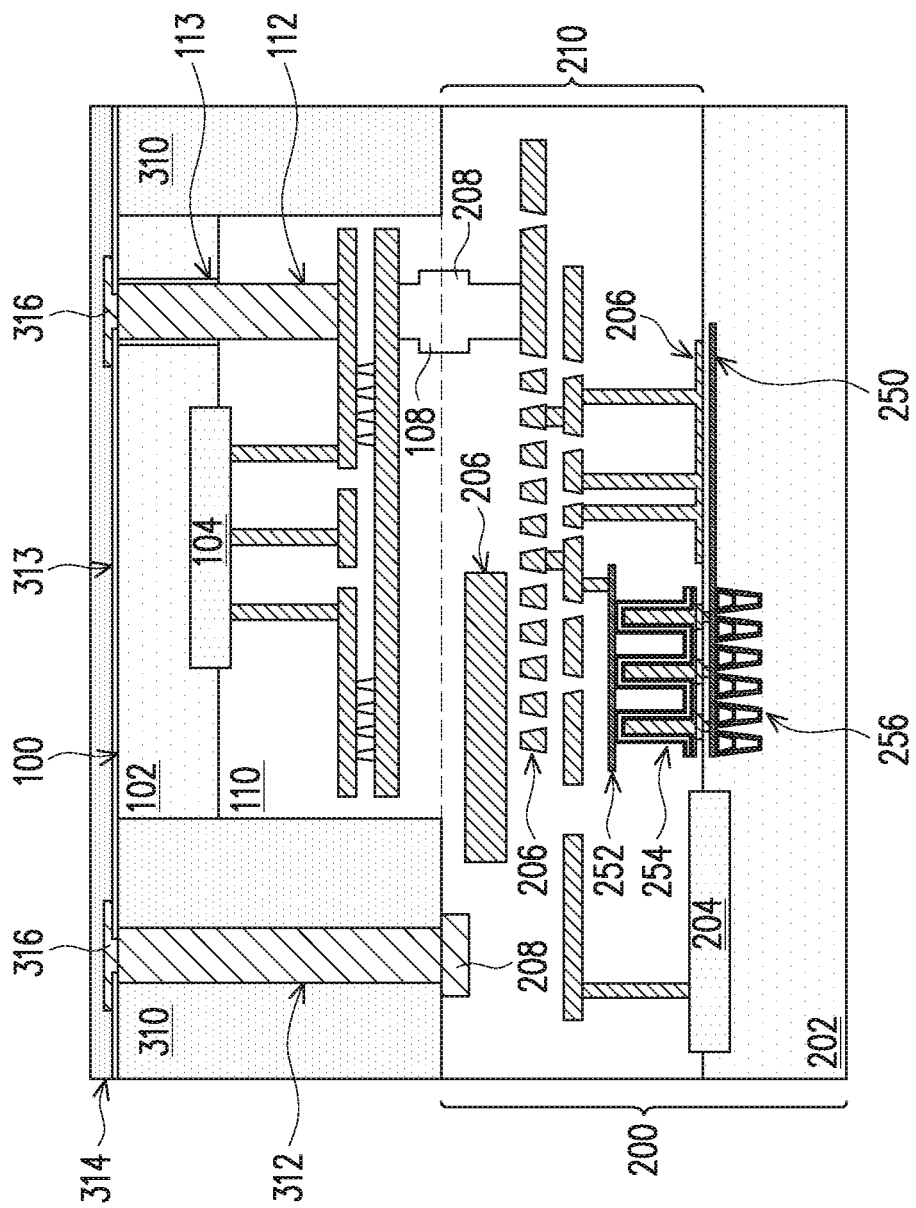

Turning to FIG. 3D, metallization pattern 316 is formed over dielectric material 310 to form electrical connections to TDVs 312 and over peripheral device 100 to form electrical connections to TSVs 112. In some embodiments, an isolation layer 313 may be formed over dielectric material 310 and peripheral device 100 before forming the metallization pattern 316. The isolation layer 313 may be a layer of an oxide, a nitride, or the like, and may be formed to prevent conductive material of the metallization pattern 316 from diffusing into dielectric material 310 or peripheral device 100. The metallization pattern 316 may be formed by forming a blanket seed layer (not shown), forming and patterning a plating mask (such as a photoresist) to reveal portions of the metal seed layer corresponding to the metallization pattern 316, plating conductive material in the openings in the plating mask, removing the plating mask, and etching the portions of the seed layer previously covered by the plating mask. In accordance with some embodiments of the present disclosure, the seed layer includes a titanium layer and a copper layer over the titanium layer. The formation of the seed layer may include, for example, a PVD process or another suitable process. In some embodiments, the plated material comprises copper or a copper alloy. The plating may include, for example, an electrochemical plating process or an electroless plating process.

Still referring to FIG. 3D, insulating layer 314 is formed over the dielectric material 310, peripheral device 100, and metallization pattern 316. In some embodiments, insulating layer 314 may comprise one or more low-k dielectric layers and/or non-low-k dielectric layers. For example, insulating layer 314 may comprise insulating materials such as silicon oxide, silicon nitride, silicon carbide, silicon oxynitride, phosphosilicate glass (PSG), borosilicate glass (BSG), boron-doped phosphosilicate glass (BPSG), a combination thereof, or the like, and may be formed using CVD, PVD, ALD, a spin-on coating process, a combination thereof, or the like. In other embodiments, insulating layer 314 may comprise one or more layers of insulating materials such as polybenzoxazole (PBO), polyimide (PI), benzocyclobutene (BCB), a combination thereof, or the like, and may be formed using a spin-on coating process, or the like. In some embodiments, insulating layer 314 is planarized, for example, using a CMP process.

Figure 3E:
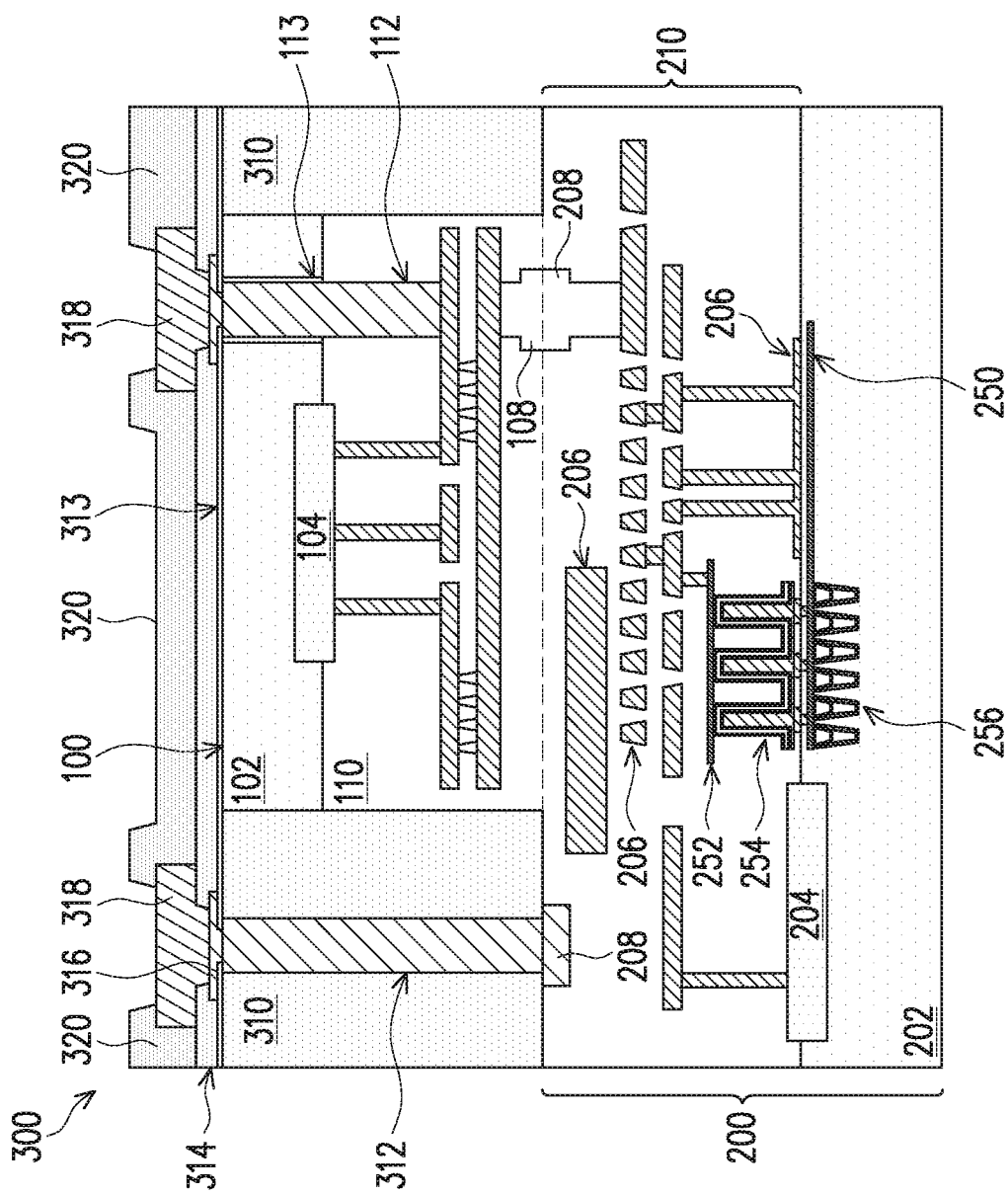
Figure 3F:
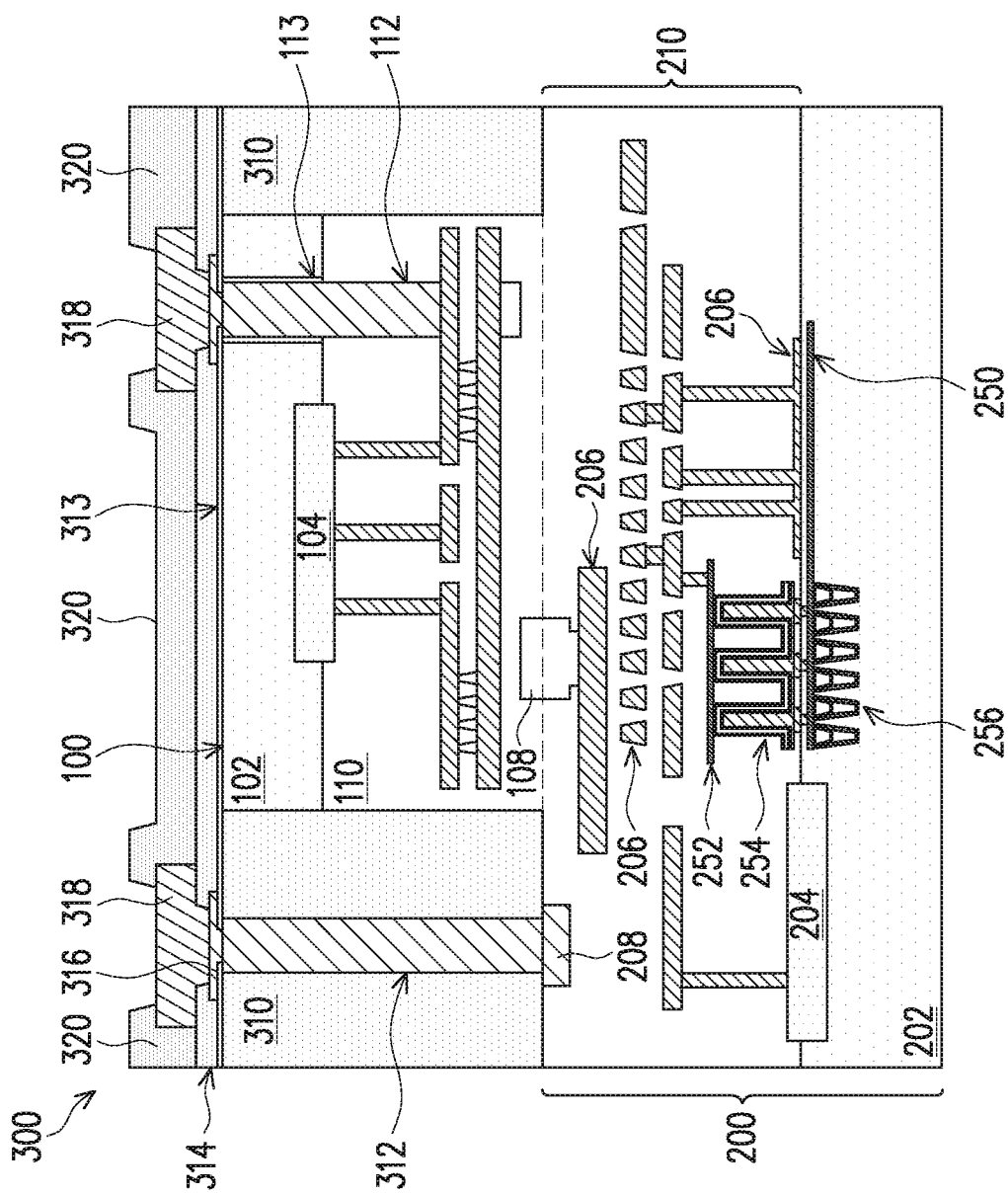

Turning to FIG. 3E, conductive pads 318 and passivation layer 320 are formed, forming a memory structure 300, in accordance with some embodiments. In some embodiments, openings in the insulating layer 314 are formed to expose regions of metallization pattern 316. The openings in the insulating layer 314 may be formed using suitable techniques such as, for example, forming a patterned photoresist layer over the insulating layer 314 and then etching the insulating layer 314 using the patterned photoresist layer as an etching mask.

In some embodiments, conductive pads 318 may be formed by first forming a seed layer (not shown) over the insulating layer 314 and within the openings in the insulating layer 314, and then forming and patterning a plating mask (such as a photoresist) to reveal portions of the seed layer corresponding to the conductive pads 318. The conductive material of conductive pads 318 may be formed in the openings in the plating mask using a plating process, the plating mask removed, and the portions of the metal seed layer previously covered by the plating mask removed by etching. The seed layer may comprise copper, titanium, nickel, gold, palladium, the like, or a combination thereof.

Other techniques may be used to form conductive pads 318. For example, the conductive material of the conductive pads 318 may be deposited as a blanket layer and then patterned to form the conductive pads 318 using a suitable photolithography and etching process. The conductive material of the conductive pads 318 may be formed by an electrochemical plating process, an electroless plating process, CVD, ALD, PVD, the like, or a combination thereof. In some embodiments, the conductive material of conductive pads 318 comprises copper, tungsten, aluminum, silver, gold, the like, or a combination thereof. In some embodiments, some conductive pads 318 may be test pads used to electrically test the memory structure 300.

After forming conductive pads 318, passivation layer 320 is formed over the insulating layer 314 and conductive pads 318, in accordance with some embodiments. Passivation layer 320 may comprise one or more low-k dielectric layers and/or non-low-k dielectric layers. For example, passivation layer 320 may comprise insulating materials such as silicon oxide, silicon nitride, silicon carbide, silicon oxynitride, phosphosilicate glass (PSG), borosilicate glass (BSG), boron-doped phosphosilicate glass (BPSG), a combination thereof, or the like, and may be formed using CVD, PVD, ALD, a spin-on coating process, a combination thereof, or the like. In other embodiments, passivation layer 320 may comprise one or more layers of insulating materials such as polybenzoxazole (PBO), polyimide (PI), benzocyclobutene (BCB), a combination thereof, or the like, and may be formed using a spin-on coating process, or the like. In some embodiments, openings may be etched in passivation layer 320 to expose conductive pads 318, as shown in FIG. 3E. In other embodiments, passivation layer 320 is planarized to expose conductive pads 318 using, for example, using a CMP process.

As shown in FIGS. 3A through 3F, by forming a memory device 200 and its associated peripheral device 100 on two different substrates and bonding them together to form a memory structure 300, the circuitry of the peripheral device 100 may be more closely placed near the components of the memory device 200. In this manner, the routing distance may be reduced and some operational characteristics of a memory structure 300, such as latency, may be improved. In some embodiments, multiple memory devices 200 may be formed on a single substrate 202, and multiple memory structures 300 formed thereon. The multiple memory structures 300 may then be singulated into individual memory structures 300 using, for example, a suitable sawing process or other dicing process.

FIGS. 4A through 4H are cross-sectional views of intermediate steps during a process for forming a memory stack 450 (see FIG. 4H), in accordance with some embodiments. In FIGS. 4A through 4H, multiple memory structures (e.g., memory structures 400) are stacked and electrical connections (e.g. redistribution structures 422 or conductive pillars 438, see FIGS. 4D-H) formed between to form a memory stack 450. It will be appreciated that the type, the number, the configuration, or the arrangement of memory structures and/or electrical connections may be different from those shown in the figures of the present disclosure, and all such variations and the like are within the scope of the present disclosure. In some embodiments, memory stack 450 is a High-Bandwidth-Memory (HBM) stack, although it should be appreciated that embodiments may be applied to other three-dimensional integrated circuit (3DIC) packages, memory packages, chip-on-wafer (CoW) packages, or the like.

Figure 4A:
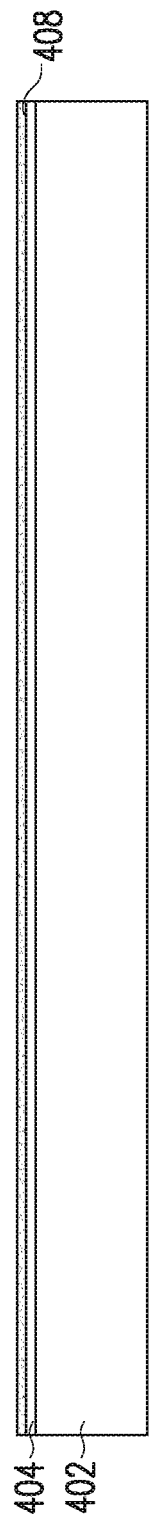
FIGS. 4A through 4H are cross-sectional views of intermediate steps during a process for forming a memory stack, in accordance with some embodiments.

In FIG. 4A, a carrier substrate 402 is provided, and a release layer 404 is formed on carrier substrate 402. Carrier substrate 402 may be a glass carrier substrate, a ceramic carrier substrate, or the like. Carrier substrate 402 may be a wafer, panel, or the like, such that multiple packages can be formed on carrier substrate 402 simultaneously. Release layer 404 may be formed of a polymer-based material, which may be removed along with carrier substrate 402 from the overlying structures that will be formed in subsequent steps. In some embodiments, release layer 404 is an epoxy-based thermal-release material, which loses its adhesive property when heated, such as a light-to-heat-conversion (LTHC) release coating. In other embodiments, release layer 404 may be an ultra-violet (UV) glue, which loses its adhesive property when exposed to UV lights. Release layer 404 may be dispensed as a liquid and cured, may be a laminate film laminated onto carrier substrate 402, or may be the like. The top surface of release layer 404 may be leveled and may have a high degree of planarity.

An optional dielectric layer 408 may be formed on release layer 404. The bottom surface of dielectric layer 408 may be in contact with the top surface of release layer 404. In some embodiments, dielectric layer 408 is formed of a polymer, such as polybenzoxazole (PBO), polyimide, benzocyclobutene (BCB), or the like. In other embodiments, dielectric layer 408 is formed of a nitride such as silicon nitride; an oxide such as silicon oxide, phosphosilicate glass (PSG), borosilicate glass (BSG), boron-doped phosphosilicate glass (BPSG), or the like; or the like. Dielectric layer 408 may be formed by any acceptable deposition process, such as spin coating, CVD, laminating, the like, or a combination thereof.

Figure 4B:
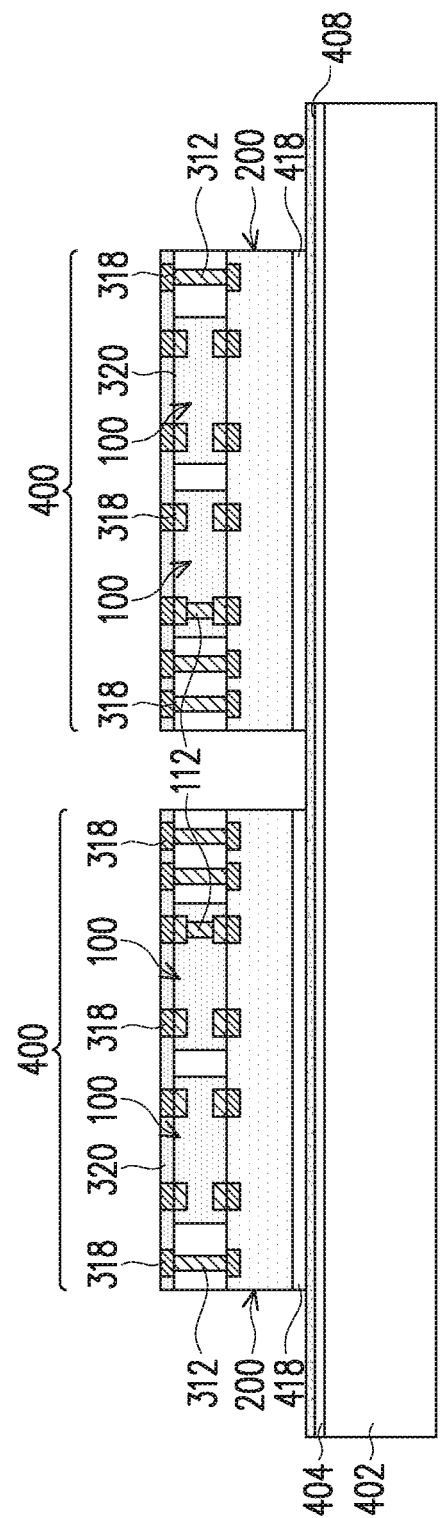

In FIG. 4B, memory structures 400 are adhered to dielectric layer 408 by an adhesive 418. In the embodiment shown in FIGS. 4B-H, memory structures 400 shown are similar to memory structures 300 described previously in FIG. 3, except that each memory structure 400 includes two peripheral devices 100, which may be different types of peripheral devices within each memory structure 400. One of the peripheral devices 100 in each memory structure 400 also includes a TSV 112 extending completely through it. Memory structures 400 shown in FIGS. 4B-H are illustrative examples, and other embodiments may include memory structures that are different than those shown. Additionally, some features of memory structures 400 shown in FIGS. 4B-H have been omitted or simplified for clarity. In some embodiments, more or fewer memory structures 400 than shown may be adhered to dielectric 408. The memory structures 400 may be, for example, a first tier of memory structures 400 of the memory stack 450 (see FIG. 4H).

Adhesive 418 is formed on back-sides of memory structures 400 and adheres memory structures 400 to carrier substrate 402, such as to dielectric layer 408. Adhesive 418 may be any suitable adhesive, epoxy, die attach film (DAF), or the like. Adhesive 418 may be applied to back-sides of memory structures 400 or may be applied over carrier substrate 402. For example, adhesive 418 may be applied to the back-sides of the memory structures 400 before a singulation process that separates individual memory structures 400.

Figure 4C:
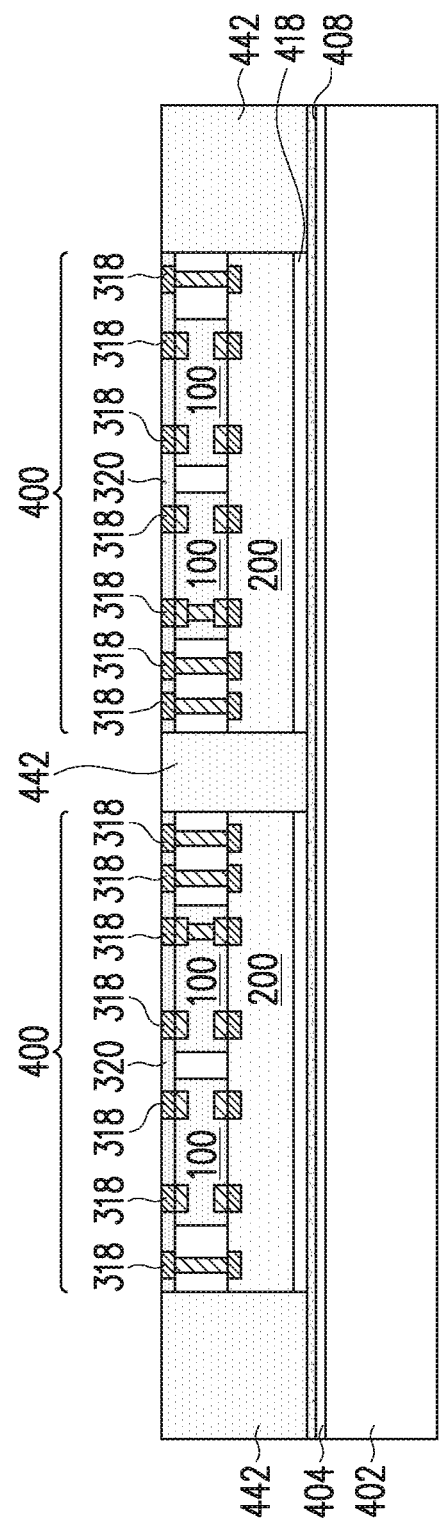

In FIG. 4C, an encapsulant 442 is formed on and around the various components. After formation, encapsulant 442 encapsulates memory structures 400. Encapsulant 442 may be a molding compound, epoxy, or the like. Encapsulant 442 may be applied by compression molding, transfer molding, or the like, and may be formed over the carrier substrate 402 such that the memory structures 400 are buried or covered. The encapsulant 442 is further formed in gap regions between the memory structures 400. The encapsulant 442 may be applied in liquid or semi-liquid form and then subsequently cured.

Still referring to FIG. 4C, a planarization process is performed on encapsulant 442. In some embodiments, the planarization process may remove portions of passivation layers 320 of each memory structure 400 to expose conductive pads 318 of each memory structure 400, as shown in FIG. 4C. In some embodiments, the planarization process does not expose conductive pads 318, and a suitable photolithography and etching process is performed to form openings in passivation layers 320 that expose conductive pads 318. Top surfaces of conductive pads 318, passivation layers 320, and encapsulant 442 may be coplanar after the planarization process. The planarization process may be, for example, a chemical-mechanical polish (CMP), a grinding process, or the like. In some embodiments, the planarization may be omitted, for example, if conductive pads 318 are already exposed.

Figure 4D:
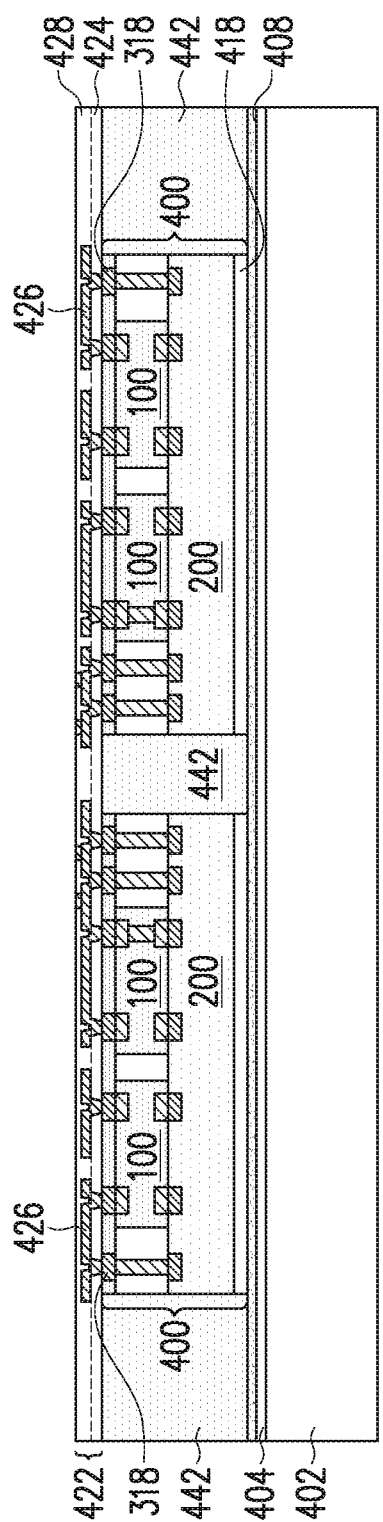

In FIG. 4D, a redistribution structure 422 is formed over the encapsulant 442 and memory structures 400. Redistribution structure 422 includes dielectric layers 424 and 428 and a metallization pattern 426. Metallization patterns may also be referred to as redistribution layers or redistribution lines. Redistribution structure 422 is shown as an example having a single metallization pattern. More or fewer dielectric layers and metallization patterns may be formed in redistribution structure 422 or in other redistribution structures, such as any of the redistribution structures 422 shown in FIGS. 4G-H or other redistribution structures mentioned in the present disclosure. If fewer dielectric layers and metallization patterns are to be formed, steps and processes discussed below may be omitted. If more dielectric layers and metallization patterns are to be formed, steps and processes discussed below may be repeated.

In FIG. 4D, dielectric layer 424 is deposited on the encapsulant 442 and memory structures 400. In some embodiments, dielectric layer 424 is formed of a photosensitive material such as PBO, polyimide, BCB, or the like, which may be patterned using a lithography mask. Dielectric layer 424 may be formed by spin coating, lamination, CVD, the like, or a combination thereof. Dielectric layer 424 is then patterned. The patterning forms openings exposing portions of the conductive pads 318. The patterning may be by an acceptable process, such as by exposing dielectric layer 424 to light when dielectric layer 424 is a photo-sensitive material or by etching using, for example, an anisotropic etching process. If dielectric layer 424 is a photo-sensitive material, dielectric layer 424 can be developed after the exposure.

Metallization pattern 426 is then formed. Metallization pattern 426 includes line portions (also referred to as conductive lines) on and extending along the major surface of dielectric layer 424. Metallization pattern 426 further includes via portions (also referred to as conductive vias) extending through dielectric layer 424 to physically and electrically couple the memory structures 400 to subsequently formed structures. As an example to form metallization pattern 426, a seed layer is formed over dielectric layer 424 and in the openings extending through dielectric layer 424. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photoresist is then formed and patterned on the seed layer. The photoresist may be formed by spin coating or the like and may be exposed to light for patterning. The pattern of the photoresist corresponds to metallization pattern 426. The patterning forms openings through the photoresist to expose the seed layer. A conductive material is then formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. The combination of the conductive material and underlying portions of the seed layer form metallization pattern 426. The photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching.

Figure 4E:
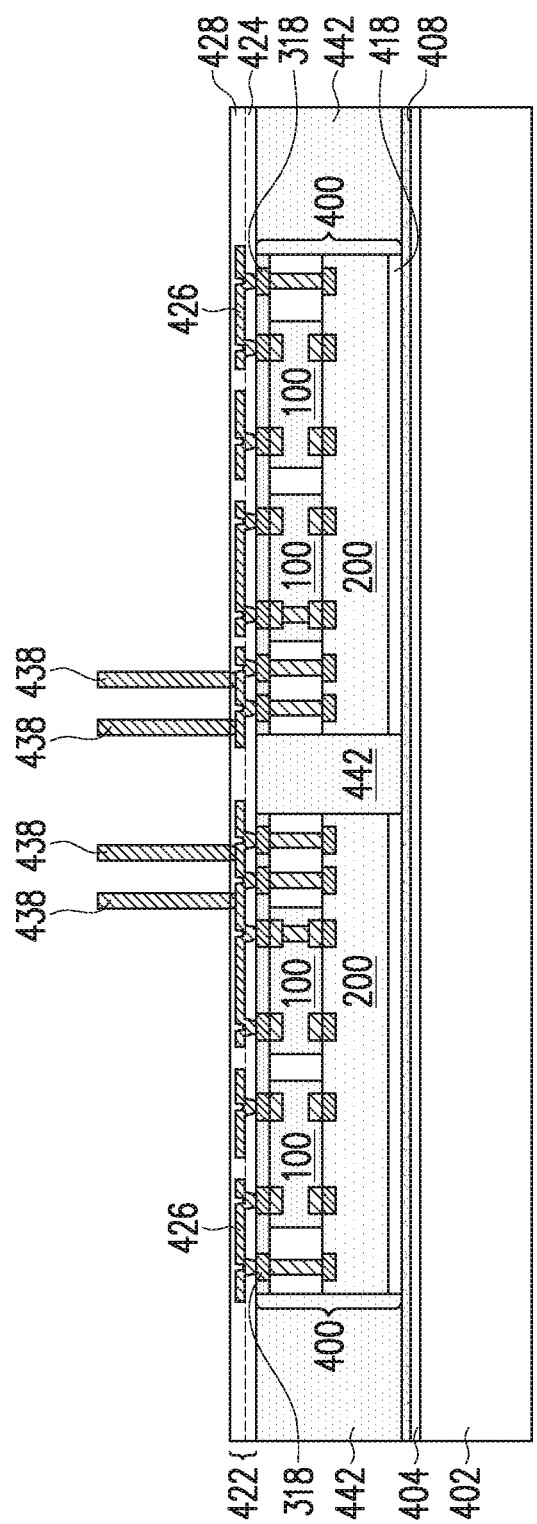

In FIG. 4E, conductive pillars 438 are formed, in accordance with some embodiments. Conductive pillars 438 are electrically connected to the redistribution structure 422, and thus may be electrically connected to memory structures 400. The topmost dielectric layer of redistribution structure 422 (e.g., dielectric layer 428) may first be patterned to form openings exposing portions of the topmost metallization pattern of redistribution structure 422 (e.g., metallization pattern 426). The patterning may be performed using an acceptable process, such as by exposing the dielectric layer 426 to light when the dielectric layer 426 is a photo-sensitive material or by etching using, for example, an anisotropic etch.

As an example to form conductive pillars 438, a seed layer (not shown) may be formed over redistribution structure 422, e.g., on dielectric layer 428 and exposed portions of metallization pattern 426. In some embodiments, the seed layer is a metal layer, which may be a single layer or a composite layer comprising a plurality of sub-layers formed of different materials. In a particular embodiment, the seed layer comprises a titanium layer and a copper layer over the titanium layer. The seed layer may be formed using, for example, PVD or the like. A photoresist may then be formed and patterned on the seed layer. The photoresist may be formed by spin coating or the like and may be exposed to light for patterning. The patterning forms openings through the photoresist to expose the seed layer. A conductive material is formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. The photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching. The remaining portions of the seed layer and conductive material form conductive pillars 438. Four conductive pillars 438 are shown in FIG. 4E, but more or fewer conductive pillars 438 may be formed in other embodiments. In some cases, the conductive pillars 438 may be considered through vias, such as through-insulation vias (TIVs).

Figure 4F:
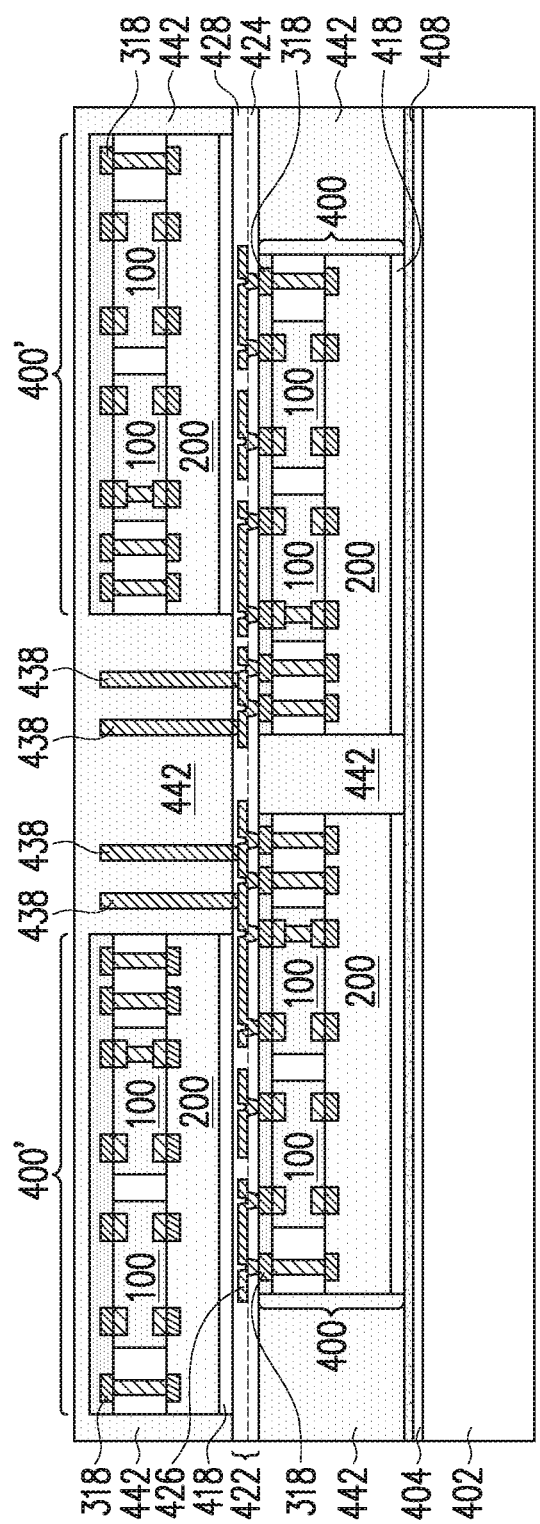
Figure 4G:
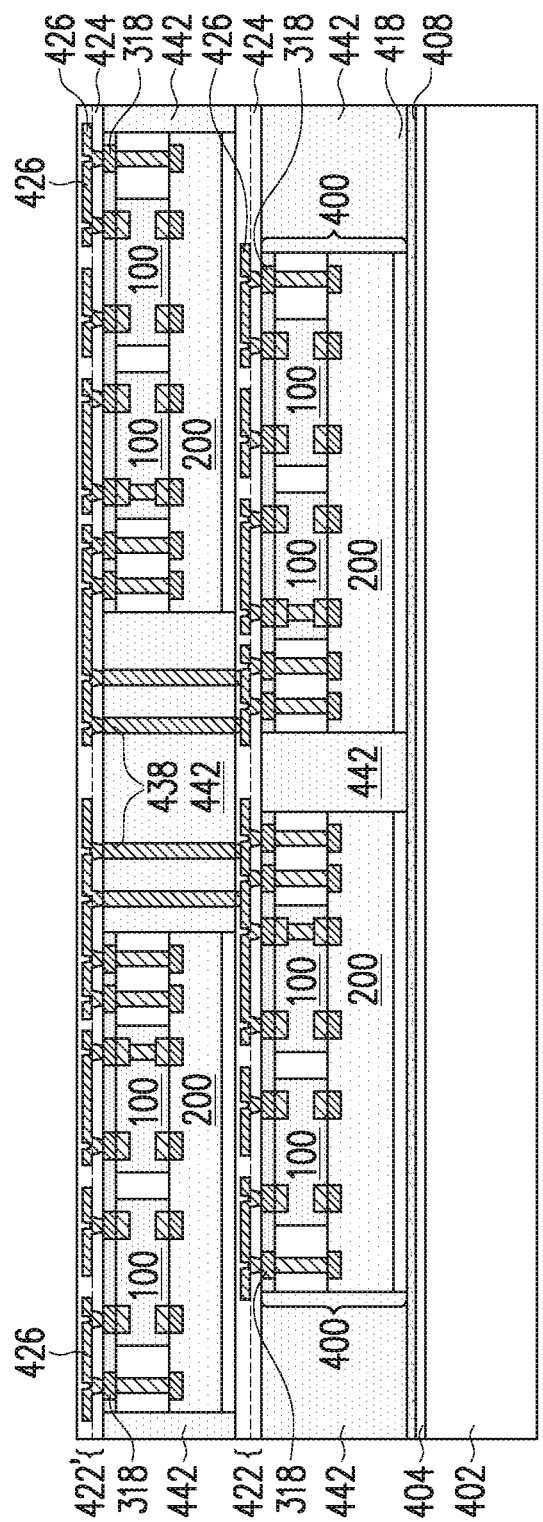
Figure 4H:
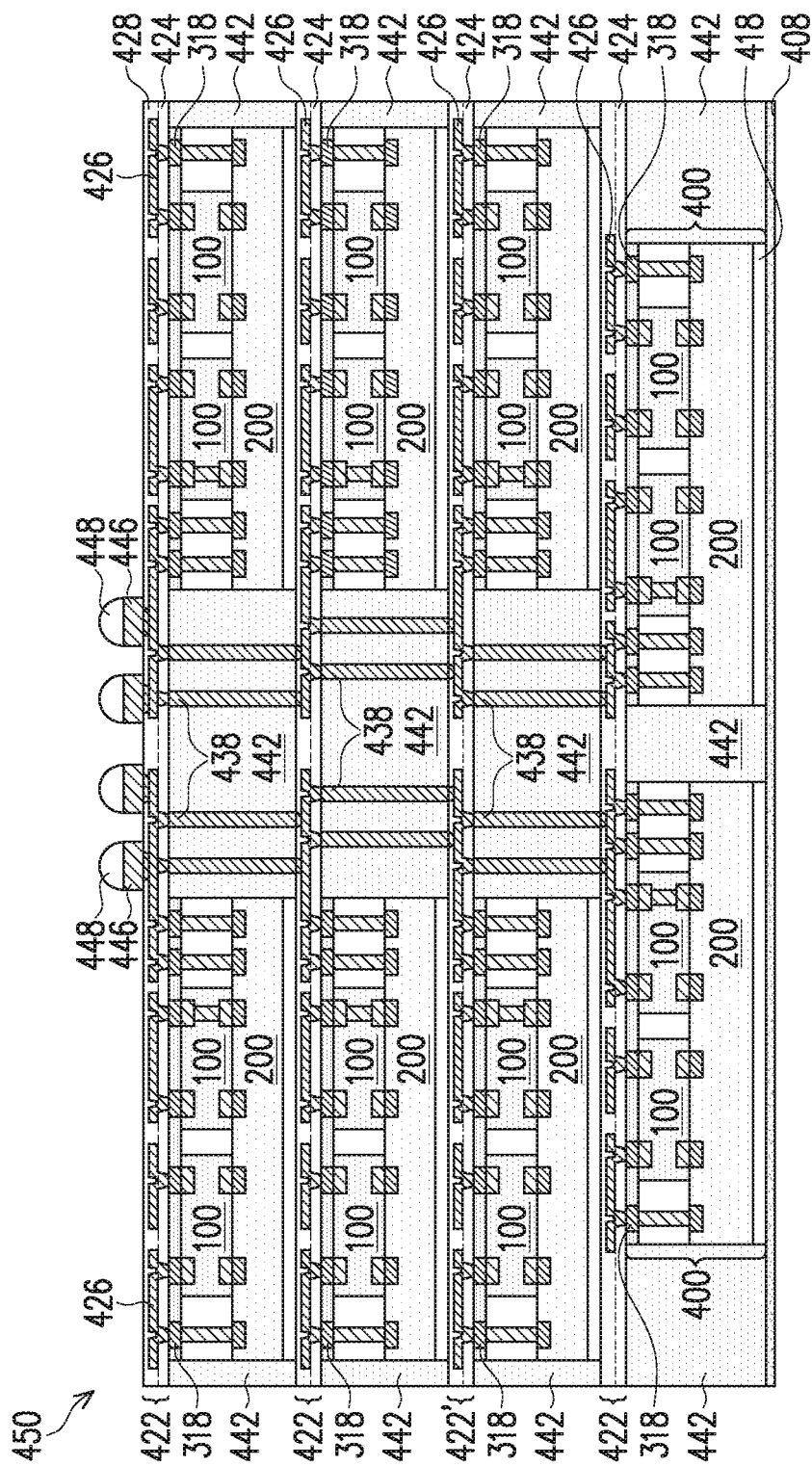

In FIG. 4F, additional memory structures 400 (labeled in FIG. 4F and sometimes described as memory structures 400') are attached to redistribution structure 422, in accordance with some embodiments. The additional memory structures 400' may be, for example, a second tier of memory structures 400 of the memory stack 450 (see FIG. 4H). The additional memory structures 400' shown in FIG. 4F may be similar to or different from the previously attached memory structures 400. In some embodiments, the additional memory structures 400' or subsequently attached memory structures may be separated by a different distance (e.g., a larger distance) than the previously attached memory structures 400, as shown in FIGS. 4F through 4H. The additional memory structures 400' may be attached in a similar manner as the previously attached memory structures 400. For example, the additional memory structures 400' may be attached to redistribution structure 422 using an adhesive 418, which may be similar to the adhesive 418 described previously in FIG. 4B. After attaching memory structures 400', an encapsulant 442 is formed on and around the memory structures 400' and conductive pillars 438. The encapsulant 442 may be similar to the encapsulant 442 described previously in FIG. 4C.

In FIG. 4G, a second redistribution structure 422 (labeled in FIG. 4G and sometimes described as redistribution structure 422') is formed over the encapsulant 442, memory structures 400, and conductive pillars 438. The second redistribution structure 422' includes dielectric layers 424 and 428 and a metallization pattern 426, and may be similar to the redistribution structure 422 described in FIG. 4D. The second redistribution structure 422' may be formed in a similar manner as the redistribution structure 422 described in FIG. 4D, and these details are not repeated here. In some embodiments, the encapsulant 442 is planarized to expose conductive pads 318 and conductive pillars 438 prior to formation of the second redistribution structure 422'. The second redistribution structure 422' may then be formed to make electrical connections to the conductive pads 318 and the conductive pillars 438.

FIG. 4H illustrates the formation of additional tiers of memory structures 400, redistribution structures 422, and conductive pillars 438 to form a memory stack 450, in accordance with some embodiments. In FIG. 4H, two additional tiers of memory structures 400 are formed over the second redistribution structure 422' of FIG. 4G. In this manner, the memory stack 450 may be considered a stacked memory structure. Each additional tier of memory structures 400 is formed with an associated redistribution structure 422 and associated conductive pillars 438. As shown in FIG. 4H, the conductive pillars 438 may be staggered such that the conductive pillars 438 of a tier are laterally offset relative to the conductive pillars 438 of adjacent tiers. In other embodiments, a memory stack 450 may have fewer or more tiers of memory structures 400 with associated redistribution structures and/or conductive pillars 438. The additional memory structures 400, redistribution structure 422, and conductive pillars 438 may be similar to those described previously in FIGS. 4B-G. The additional memory structures 400, redistribution structure 422, and conductive pillars 438 may be formed in a similar manner as those described previously in FIGS. 4B-G, and the details of formation are not repeated here.

Still referring to FIG. 4H, UBMs 446 are formed for external connection to the topmost redistribution structure 422. The UBMs 446 have bump portions on and extending along the major surface of the topmost dielectric layer 428, and have via portions extending through the dielectric layer 428 to physically and electrically couple the metallization pattern 426 of the topmost redistribution structure 422. As a result, the UBMs 446 are electrically coupled to the multiple redistribution structures 422 and memory structures 400 of the memory stack 450. In some cases, the use of memory structures 400 having peripheral devices 100 bonded to memory devices 200 can allow for shorter electrical connections between memory structures 400 and within each memory structure 400, which can improve the response speed of the memory stack 450 during operation. The UBMs 446 may be formed of the same material as the metallization pattern 426. In some embodiments, the UBMs 446 have a different size than the metallization patterns 426.

Still referring to FIG. 4H, conductive connectors 448 are formed on the UBMs 446. The conductive connectors 448 may be ball grid array (BGA) connectors, solder balls, metal pillars, controlled collapse chip connection (C4) bumps, micro bumps, electroless nickel-electroless palladium-immersion gold technique (ENEPIG) formed bumps, or the like. The conductive connectors 448 may include a conductive material such as solder, copper, aluminum, gold, nickel, silver, palladium, tin, the like, or a combination thereof. In some embodiments, the conductive connectors 448 are formed by initially forming a layer of solder through evaporation, electroplating, printing, solder transfer, ball placement, or the like. Once a layer of solder has been formed on the structure, a reflow may be performed in order to shape the material into the desired bump shapes. In another embodiment, the conductive connectors 448 comprise metal pillars (such as a copper pillar) formed by a sputtering, printing, electro plating, electroless plating, CVD, or the like. The metal pillars may be solder free and have substantially vertical sidewalls. In some embodiments, a metal cap layer is formed on the top of the metal pillars. The metal cap layer may include nickel, tin, tin-lead, gold, silver, palladium, indium, nickel-palladium-gold, nickel-gold, the like, or a combination thereof and may be formed by a plating process. In some embodiments, dummy UBMs 446 and dummy conductive connectors 448 (not shown in FIG. 4H) that are not electrically connected to the topmost redistribution structure 422 may be formed to provide stability during subsequent processing steps.

As shown in FIG. 4H, a de-bonding may be performed to detach (or "de-bond") carrier substrate 402 from dielectric layer 408. In accordance with some embodiments, the de-bonding includes projecting a light such as a laser light or an UV light on release layer 404 so that release layer 404 decomposes under the heat of the light and carrier substrate 402 can be removed. In some embodiments, multiple memory stacks 450 may be formed on the carrier substrate 402 and then singulated to form individual memory stacks 450.

FIGS. 5A through 5E are cross-sectional views of intermediate steps during a process for forming a memory package 500 (see FIG. 5E), in accordance with some embodiments. In FIGS. 5A through 5E, a memory stack (e.g., memory stack 450) is attached to a logic device 520 to form the memory package 500. In some embodiments, memory package 500 includes a High-Bandwidth-Memory (HBM) stack, although it should be appreciated that embodiments may be applied to other three-dimensional integrated circuit (3DIC) packages, memory packages, chip-on-wafer (CoW) packages, or the like.

In FIG. 5A, a carrier substrate 502 is provided, and a release layer 504 is formed on carrier substrate 502. Carrier substrate 502 may be a substrate similar to those described previously for carrier substrate 402 (see FIG. 4A). Release layer 504 may be a layer similar to those described previously for release layer 404 (see FIG. 4A).

Logic device 520 is placed on release layer 504, and may be attached to release layer 504 using a DAF or the like (not shown), in accordance with some embodiments. Logic device 520 may be, for example, a logic die or a logic wafer including a plurality of logic devices 520. In accordance with other embodiments, logic device 520 is another type of device or wafer, such as an input-output wafer, an interposer wafer, or the like. Logic device 520 may comprise, for example, a CPU die, a GPU die, an AP die, a mixed logic die, an I/O die, circuitry that operates similarly to one or more of these example die, combinations thereof, or the like. Logic device 520 includes a substrate 510, an interconnect structure 506, and through vias 526.

Substrate 510 may be a bulk semiconductor substrate, SOI substrate, multi-layered semiconductor substrate, or the like. The semiconductor material of substrate 510 may be silicon, germanium, a compound semiconductor including silicon germanium, silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. Substrate 510 may be doped or undoped. Devices 508 may be formed at a surface of substrate 510. Devices 508 may comprise active devices (e.g., transistors, diodes, etc.), and/or passive devices (e.g., capacitors, resistors, etc.).

Through vias 526 are formed to extend from a surface of substrate 510 into substrate 510. Through vias 526 are also sometimes referred to as through-substrate vias or through-silicon vias (TSVs) when substrate 510 is a silicon substrate. Through vias 526 may be formed by forming recesses in substrate 510 by, for example, etching, milling, laser techniques, a combination thereof, or the like. A thin barrier layer 528 may be deposited over the front side of substrate 510 and in the openings, such as by CVD, atomic layer deposition (ALD), physical vapor deposition (PVD), thermal oxidation, combinations thereof, and/or the like. Barrier layer 528 may be formed from an oxide, a nitride, or an oxynitride, such as titanium nitride, titanium oxynitride, tantalum nitride, tantalum oxynitride, tungsten nitride, silicon oxide, combinations thereof, and/or the like. A conductive material may be deposited over the thin barrier layer and in the openings, forming through vias 526. The conductive material may be formed by an electro-chemical plating process, CVD, ALD, PVD, combinations thereof, or the like. Examples of conductive materials are copper, tungsten, aluminum, silver, gold, combinations thereof, or the like. Excess conductive material and barrier layer 528 may be removed from the front side of the substrate 510 using, for example, a CMP process. Thus, through vias 526 may include a conductive material, with a thin barrier layer 528 between the conductive material and substrate 510.

Interconnect structure 506 is formed over a surface of substrate 510, and is used to electrically connect devices 508 (if any) of substrate 510 and/or through vias 526 together and/or to external devices. Interconnect structure 506 may be formed on the same side of substrate 510 as devices 508.

Interconnect structure 506 may include one or more dielectric layer(s) and respective metallization pattern(s) in the dielectric layer(s). The metallization patterns may include vias and/or traces to interconnect any devices and/or through vias 526 together and/or to an external device. The dielectric layers may be formed from silicon oxide, silicon nitride, silicon carbide, silicon oxynitride, low-K dielectric material, such as PSG, BPSG, FSG, silicon oxycarbide, Spin-On-Glass, Spin-On-Polymers, silicon carbide material, compounds thereof, composites thereof, combinations thereof, or the like. The dielectric layers may be deposited by any suitable method, such as spin coating, CVD, PECVD, HDP-CVD, or the like. A metallization pattern may be formed in the dielectric layer, for example, by using photolithography techniques to deposit and pattern a photoresist material on the dielectric layer to expose portions of the dielectric layer that are to become the metallization pattern. An etch process, such as an anisotropic dry etch process, may be used to create recesses and/or openings in the dielectric layer corresponding to the exposed portions of the dielectric layer. The recesses and/or openings may be lined with a diffusion barrier layer and filled with a conductive material. The diffusion barrier layer may be formed from one or more layers of tantalum nitride, tantalum, titanium nitride, titanium, cobalt tungsten, combinations thereof, or the like, and may be deposited by ALD or the like. The conductive material may be formed from copper, aluminum, tungsten, silver, combinations thereof, or the like, and may be deposited by CVD, PVD, or the like. Any excessive diffusion barrier layer and/or conductive material on the dielectric layer may be removed, such as by using a CMP process.

In FIG. 5B, a planarization process is performed to thin the substrate 510 of logic device 520 and expose through vias 526. The planarization process may be, for example, a grinding process or a CMP process.

Figure 5C:
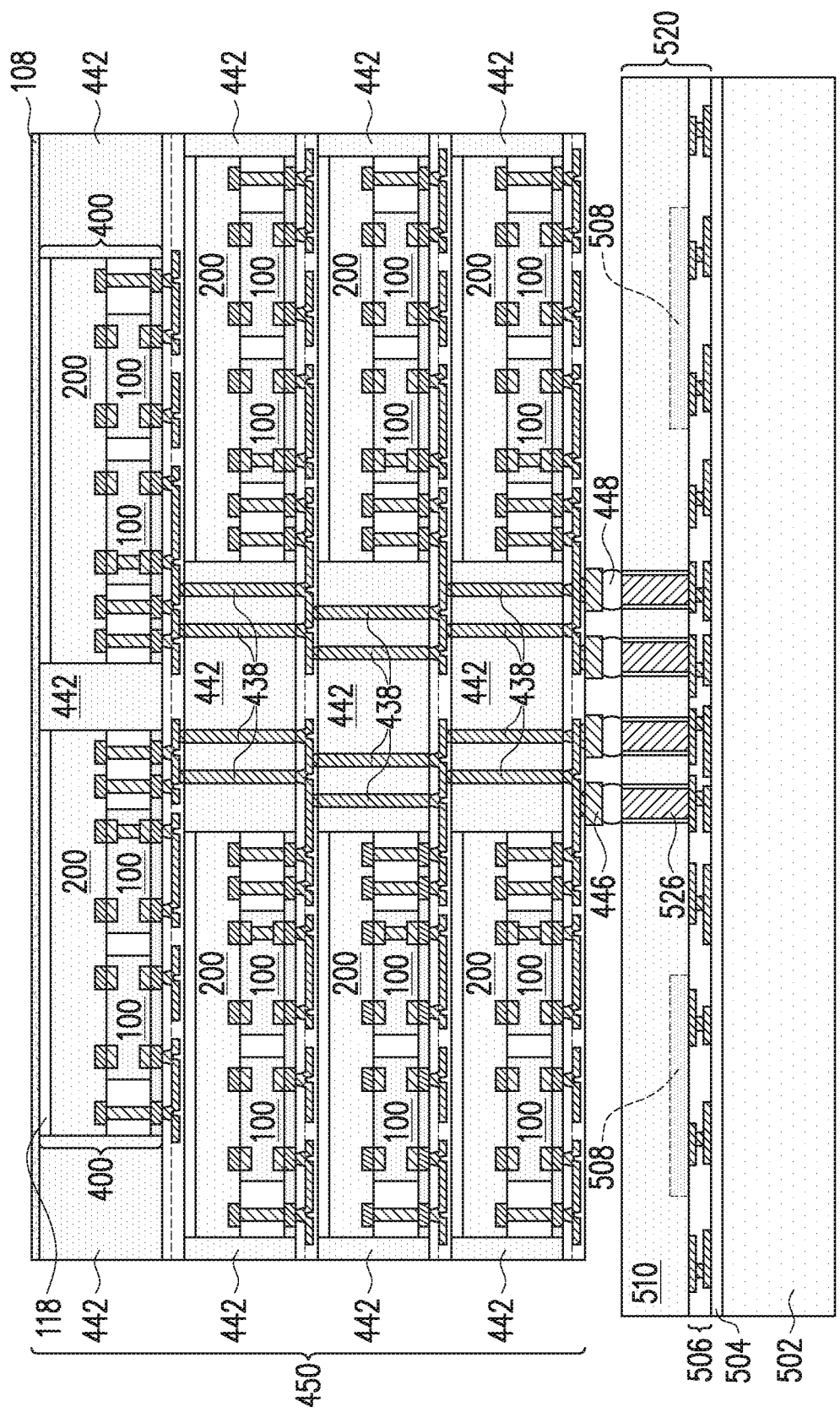
Figure 5D:
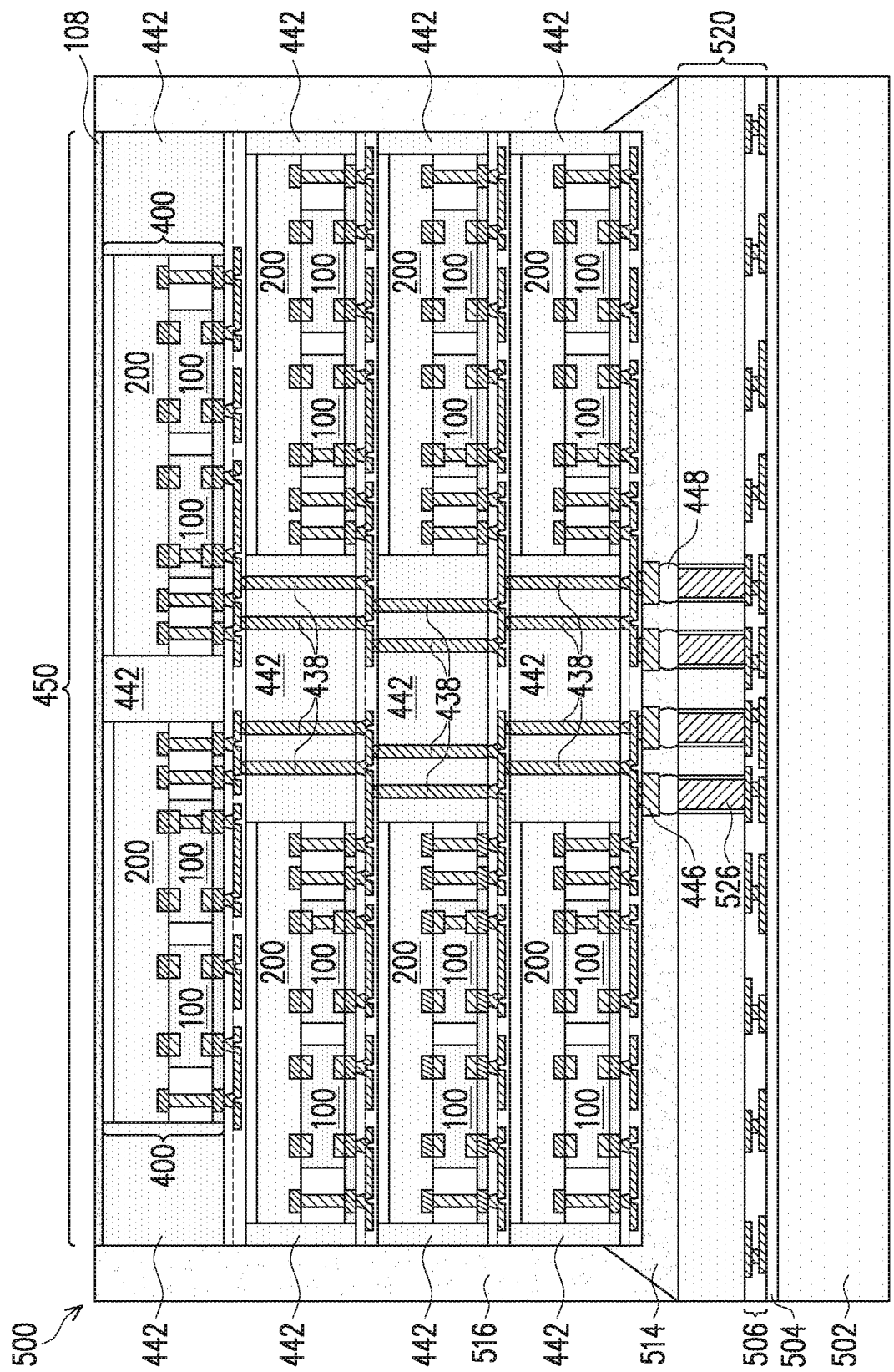
Figure 5E:
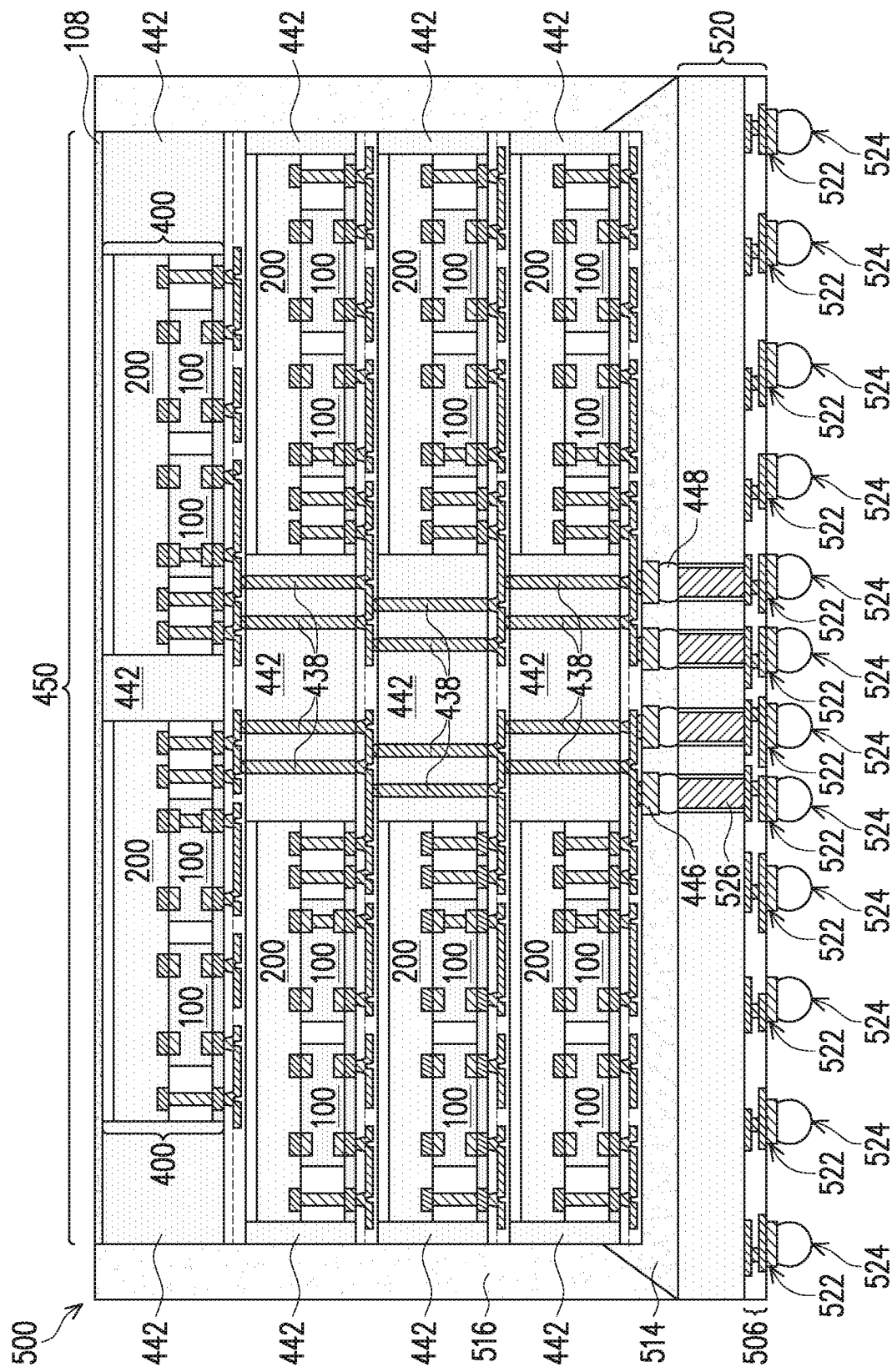

Turning to FIG. 5C, a memory stack is attached to the logic device 520, in accordance with some embodiments. In FIGS. 5C-E, the memory stack shown is the memory stack 450 as described in FIGS. 4A-H, but other memory stacks may be used in other embodiments, such as the memory stacks described below in FIGS. 6-8 or the like. Conductive connectors 448 of memory stack 450 are connected to through vias 526 of logic device 520, thus forming physical and electrical connections between memory stack 450 and logic device 520. After placing conductive connectors 448 on through vias 526, a reflow process may be performed to bond the material of the conductive connectors 448 to through vias 526. In some embodiments, solder bumps or the like may be formed on the through vias 526 prior to attachment of conductive connectors 448.

In FIG. 5D, an underfill material 514 and a molding material 516 are formed on memory stack 450, in accordance with some embodiments. Underfill material 514 is dispensed between memory stack 450 and logic device 520 such that underfill material 514 surrounds conductive connectors 448. Underfill material 514 may be any acceptable material, such as a polymer, epoxy, molding underfill, or the like. Underfill material 514 may be dispensed using a capillary flow process in some embodiments. Molding material 516 is then formed over memory stack 450. Molding material 516 may be an encapsulant, a molding compound, an epoxy, or the like, and may be applied using compression molding, transfer molding, or the like. Molding material 516 may be formed over memory stack 450 such that the memory stack 450 and underfill material 514 are buried or covered. Molding material 516 may be subsequently cured. In some embodiments, a planarization process (e.g., a grinding or CMP process) may be performed to remove excess molding material 516 from over memory stack 450. In some embodiments, the planarization process may expose dielectric layer 108 or may remove dielectric layer 108 of the memory stack 450.

In FIG. 5E, carrier substrate 502 is de-bonded and external connectors 524 are formed, forming memory package 500, in accordance with some embodiments. As shown in FIG. 5E, a de-bonding may be performed to detach (or "de-bond") carrier substrate 502 from logic device 520. In accordance with some embodiments, the de-bonding includes projecting a light such as a laser light or an UV light on release layer 504 so that release layer 504 decomposes under the heat of the light and carrier substrate 502 can be removed.

Still referring to FIG. 5E, UBMs 522 may be formed for external connection to the interconnect structure 506 of logic device 520. UBMs 522 have bump portions on and extending along the major surface of interconnect structure 506, and may have via portions extending through interconnect structure 506. External connectors 524 are formed on the UBMs 522. External connectors 524 may be BGA connectors, solder balls, metal pillars, C4 bumps, micro bumps, ENEPIG formed bumps, or the like. External connectors 524 may include a conductive material such as solder, copper, aluminum, gold, nickel, silver, palladium, tin, the like, or a combination thereof. In some embodiments, external connectors 524 are formed by initially forming a layer of solder through evaporation, electroplating, printing, solder transfer, ball placement, or the like. Once a layer of solder has been formed on the structure, a reflow may be performed in order to shape the material into the desired bump shapes. In another embodiment, external connectors 524 comprise metal pillars (such as a copper pillar) formed by a sputtering, printing, electro plating, electroless plating, CVD, or the like. The metal pillars may be solder free and have substantially vertical sidewalls. In some embodiments, a metal cap layer is formed on the top of the metal pillars. The metal cap layer may include nickel, tin, tin-lead, gold, silver, palladium, indium, nickel-palladium-gold, nickel-gold, the like, or a combination thereof, and may be formed by a plating process.

Figure 6:
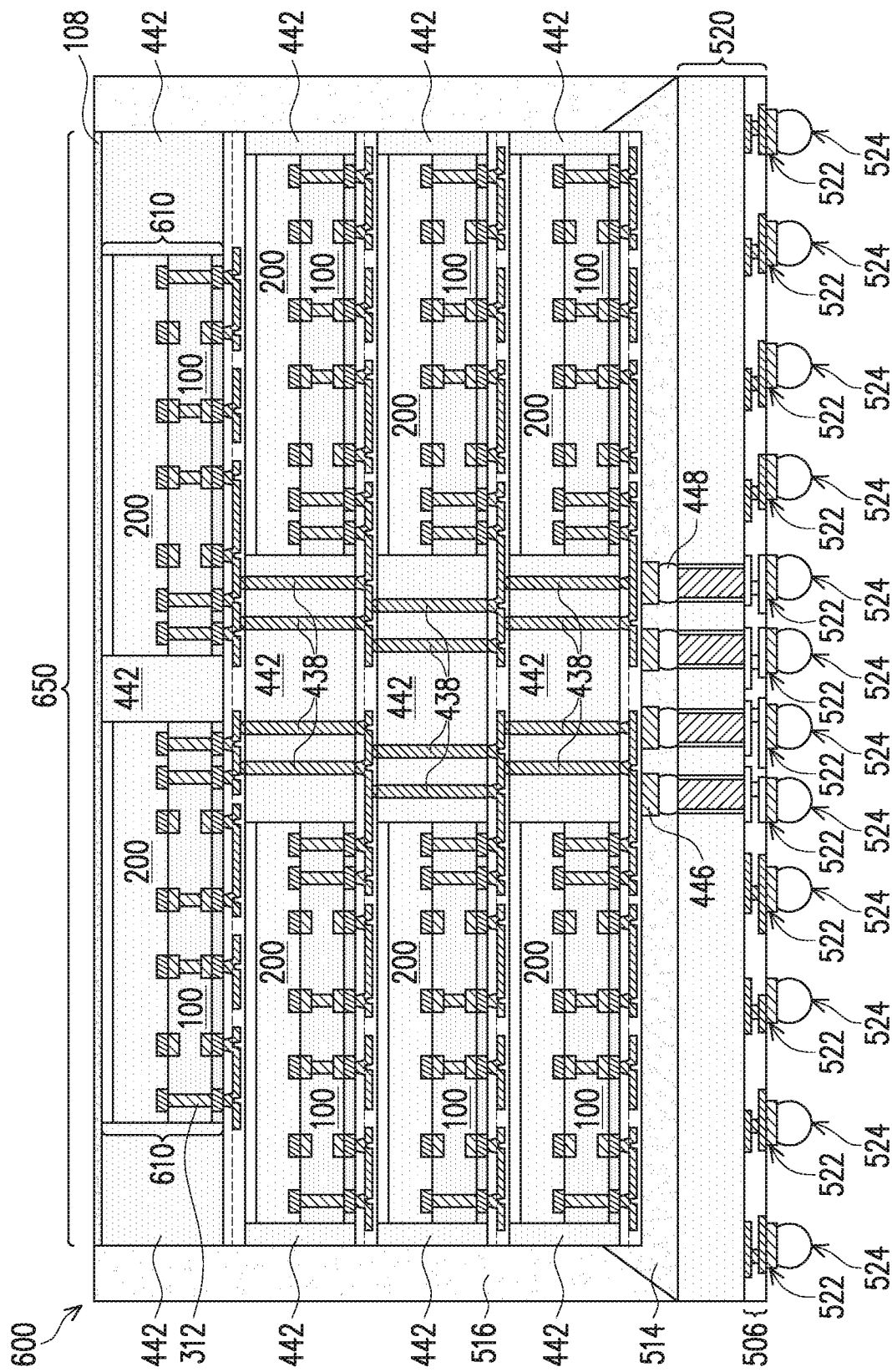
FIGS. 6 through 9 illustrate the cross-sectional views of memory packages, in accordance with some embodiments.
Figure 7:
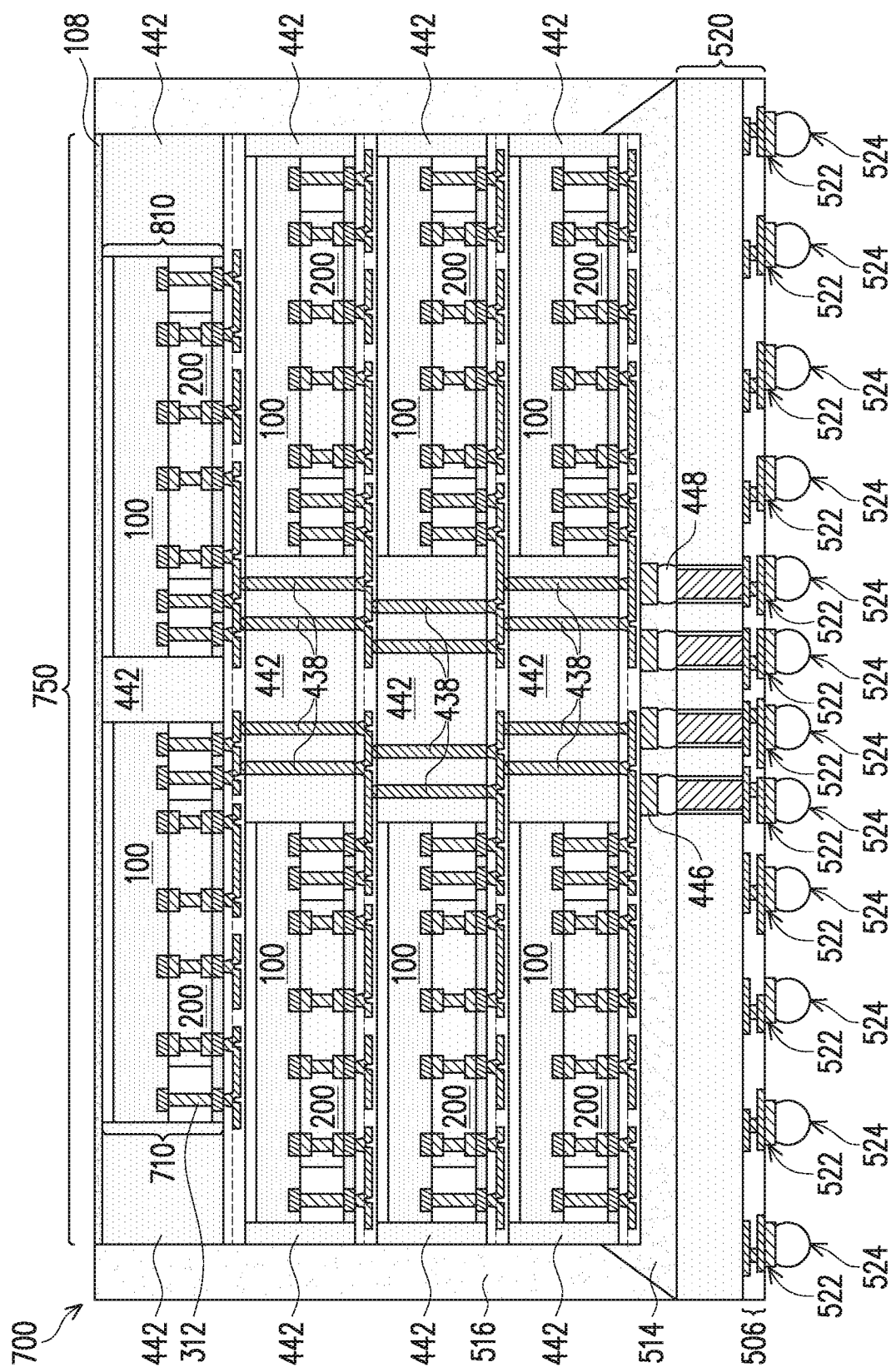
Figure 8:
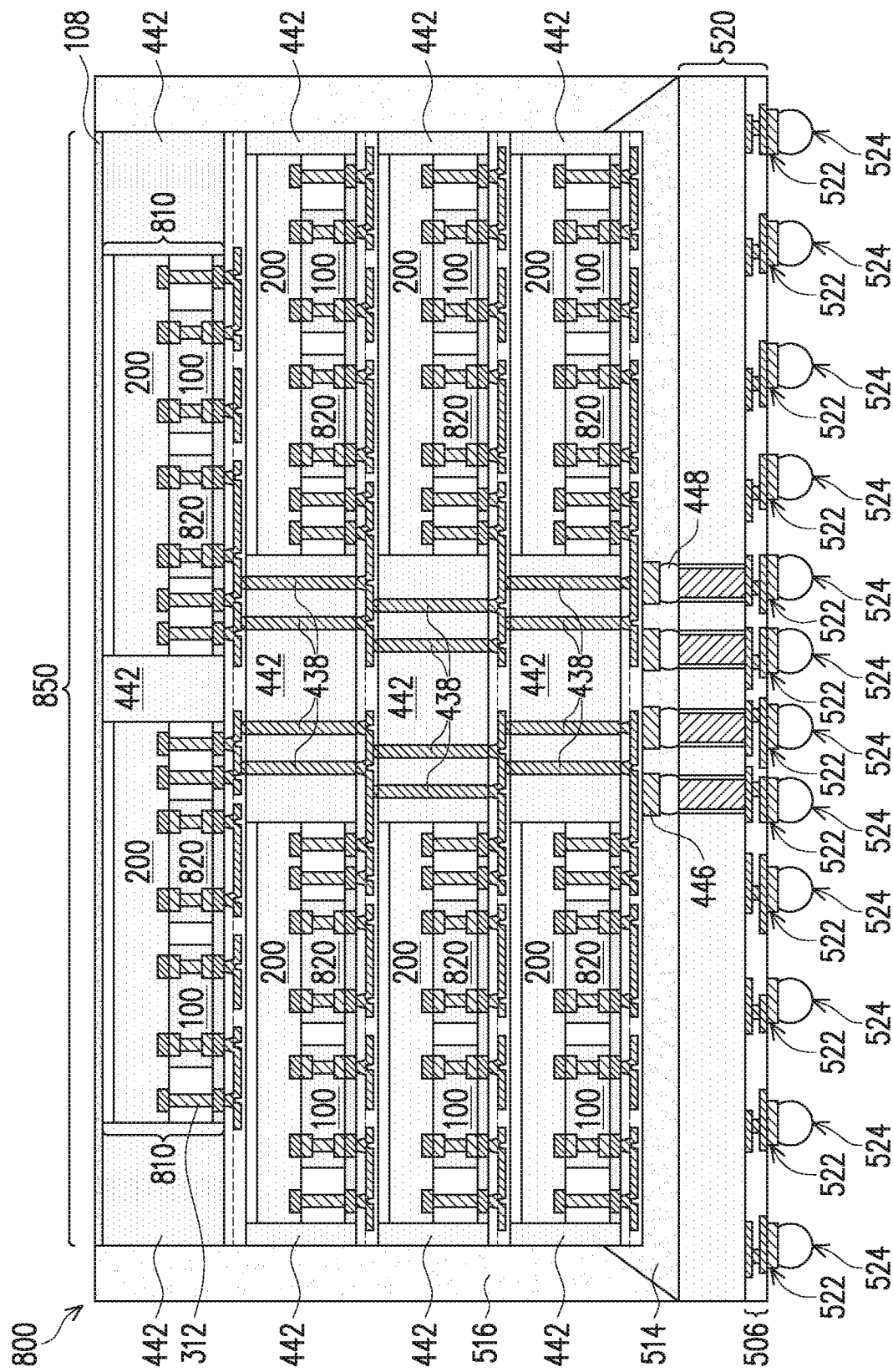

FIGS. 6 through 8 show memory packages 600, 700, and 800, in accordance with some embodiments. Memory packages 600, 700, and 800 are similar to memory package 500 shown in FIG. 5E, except that the memory structures 610, 710, and 810 respectively included in memory packages 600, 700, and 800 have different features. The memory structures 610, 710, and 810 shown in FIGS. 6-8 are intended as illustrative examples, and variations or combinations of the features shown and/or other features not shown are intended to be within the scope of the present disclosure. Each of the memory structures 610, 710, and 810 include bonding a peripheral device 100 to a memory device 200, similar to memory structures 300 and 400 described previously, and thus have some similar advantages such as reduced latency and improved high-speed operation. Any of the memory structures described in this disclosure may be used in any of the memory stacks or memory packages described in this disclosure, in any suitable configuration or combination.

Turning to FIG. 6, the memory package 600 shown includes a memory stack 650 with memory structures 610. Memory structures 610 are similar to memory structures 300 and 400 described previously, except that each memory structure 610 includes a peripheral device 100 that is the same size as the memory device 200. The memory structures 610 may be formed by, for example, forming peripheral devices 100 on a first wafer and memory devices 200 on a second wafer, and then bonding the peripheral devices 100 to the memory devices 200 using wafer-to-wafer hybrid bonding or the like. In this manner, process steps associated with the formation of dielectric material 310 (see FIG. 3B) can be eliminated. This can reduce the number of processing steps and the processing cost of memory structure 610.

Turning to FIG. 7, the memory package 700 shown includes a memory stack 750 with memory structures 710. Memory structures 710 are similar to memory structures 300 and 400 described previously, except that each memory structure 710 includes a peripheral device 100 that is larger than the memory device 200. The memory structures 710 may be formed in a manner similar to that described in FIGS. 3A-3F except that the dielectric material 310 may be formed surrounding the smaller memory device 200. In other words, the positions of the peripheral device 100 and memory device 200 are reversed with respect to memory structure 300. In some embodiments, a peripheral device 100 may have a length or width that is between about 15 mm and about 5 mm, and a memory device 200 may have a length or width that is between about 12 mm and about 3 mm. In some embodiments, the peripheral or processor device 100 may have a length or width that is between about 300% and about 100% of the corresponding length or width of the memory device 200. In some embodiments, a peripheral or processor device 100 may have an area that is between about 25 mm$^2$ and about 225 mm$^2$, and a memory device 200 may have an area that is between about 9 mm$^2$ and about 144 mm$^2$. In this manner, the processes and memory packages described herein may be used with peripheral devices 100 or memory devices 200 having different dimensions or sizes.

Turning to FIG. 8, the memory package 800 shown includes a memory stack 850 with memory structures 810. Memory structures 810 are similar to memory structures 300 and 400 described previously, except that each memory structure 810 includes a device 820 that is bonded to a memory device 200 in addition to a peripheral device 100. The device 820 may be a different peripheral device than the peripheral device 100 or a different type of device. For example, the device 820 may be an integrated passive device (IPD), voltage regulator, capacitor, memory device, logic device, the like, or any suitable device including active and/or passive components. The device 820 may include, for example, deep-trench capacitors, metal-insulator-metal capacitors, inductors, resistors, the like, or a combination thereof. More than one peripheral device 100 or device 820 of similar or different types may be included within a memory structure. In this manner, a memory package may include different types of devices, which may be formed using different technologies.

Figure 9:
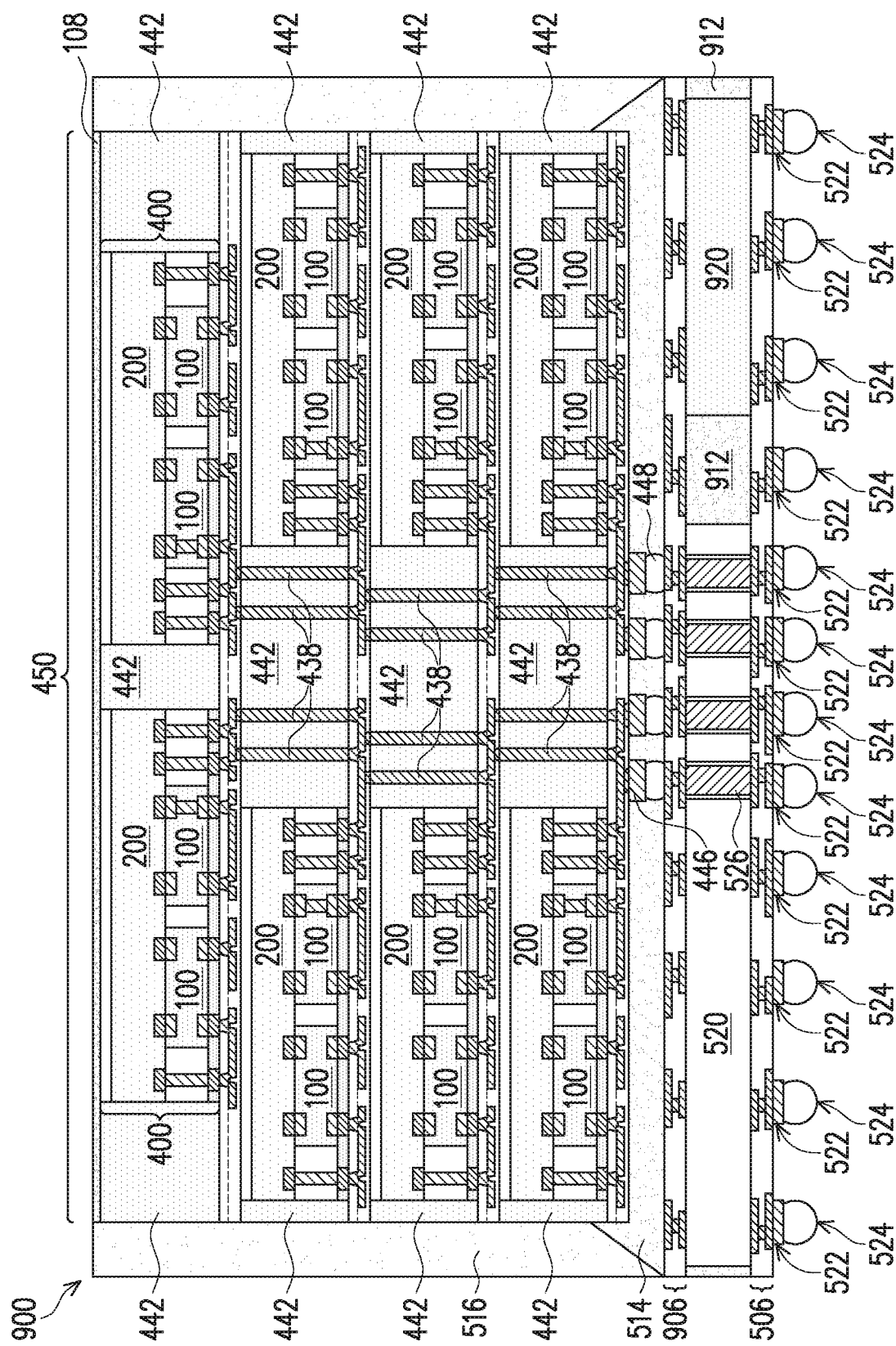

Turning to FIG. 9, a memory package 900 is shown, in accordance with some embodiments. The memory package 900 is similar to the memory package 500 shown in FIG. 5E, except that the memory package includes a device 920 attached to interconnect structure 506 in addition to logic device 520. The device 920 may be an additional logic device (similar to or different than logic device 520), an IPD, an I/O device, the like, or any suitable device including active and/or passive components. The device 920 may include, for example, deep-trench capacitors, metal-insulator-metal capacitors, inductors, resistors, the like, or a combination thereof. More than one device 920 of similar or different types may be included within a memory package such as memory package 900. In some embodiments, the memory package 900 may be formed by, for example, attaching the logic device 520 and the device 920 to a carrier substrate (not shown) and encapsulating by a molding material 912. The molding material 912 may be planarized (e.g. by a CMP process) and the interconnect structure 506 formed over the front side of the logic device 520 and device 920 as described previously in FIG. 5A. Another planarization process may be performed to expose through vias 526, and then a second interconnect structure 906 may be formed over the back side of the logic device 520 and device 920. The second interconnect structure 906 may be formed in a similar manner as interconnect structure 506, or may be formed using a different technique. The interconnect structure 506 and/or the second interconnect structure 906 may make electrical connection to the device 920. In some embodiments, the second interconnect structure 906 may be omitted. The memory stack 450 may then be attached in a manner similar to that described in FIG. 5C. In this manner, multiple devices and different devices may be incorporated into a memory package. In some cases, incorporating multiple devices as described may reduce electrical routing distance between the devices, which can reduce latency and improve high-speed operation of the memory package.

FIGS. 10A through 10D are cross-sectional views of intermediate steps during a process for forming a memory package 1000 (see FIG. 10D), in accordance with some embodiments. In FIGS. 10A through 10D, logic devices 1020 and 1030 are attached to a memory stack 1050 to form the memory package 1000. In some embodiments, memory package 500 includes a High-Bandwidth-Memory (HBM) stack, although it should be appreciated that embodiments may be applied to other three-dimensional integrated circuit (3DIC) packages, memory packages, chip-on-wafer (CoW) packages, or the like.

Figure 10A:
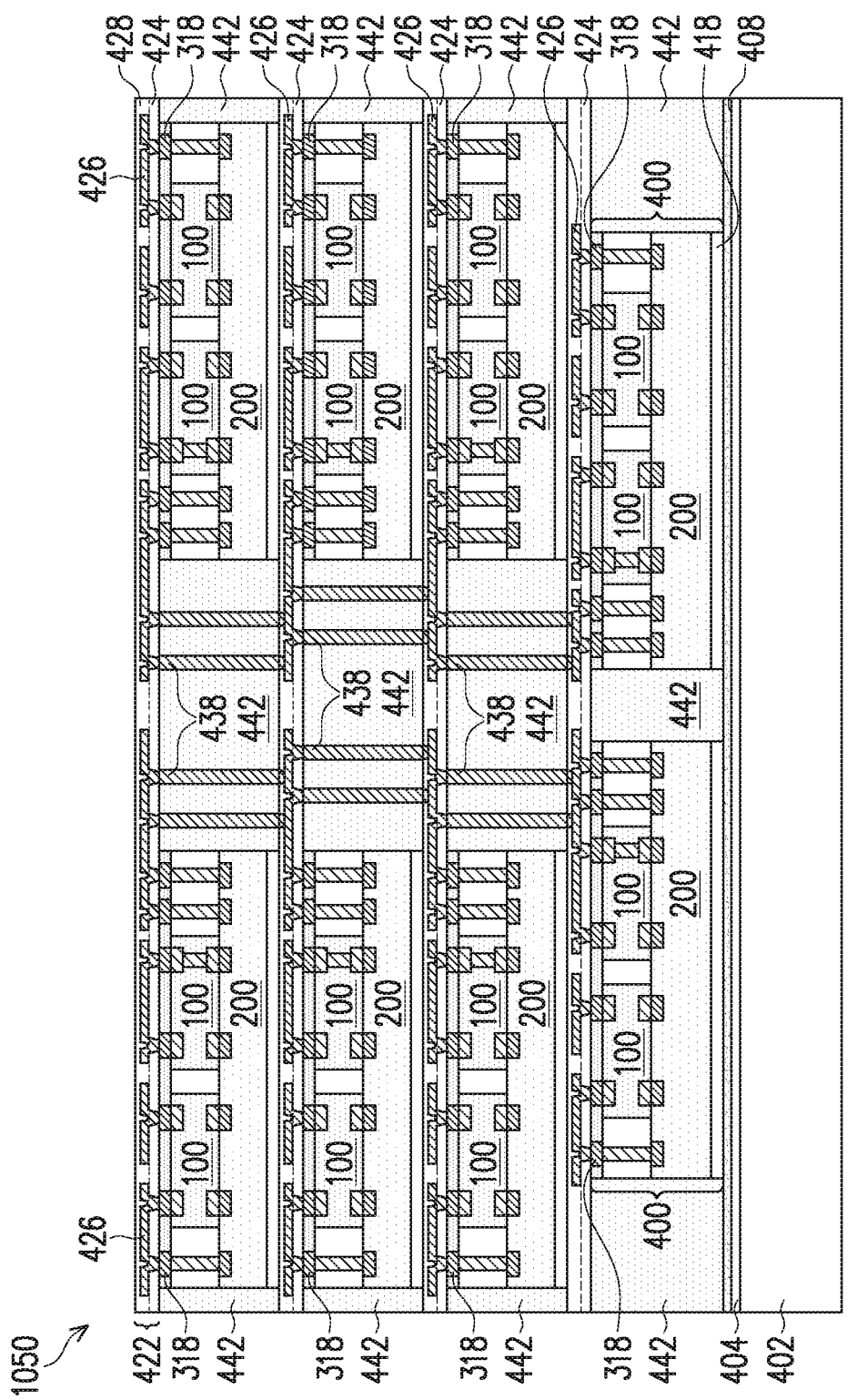
FIGS. 10A through 10D are cross-sectional views of intermediate steps during a process for forming a memory package, in accordance with some embodiments.

Turning to FIG. 10A, a memory stack 1050 is shown, in accordance with some embodiments. Memory stack 1050 is similar to memory stack 450 shown in FIG. 4H, except that UBMs 446 and conductive connectors 448 are not formed on the topmost redistribution structure 422, and the carrier substrate 402 is not de-bonded. Memory stack 1050 may be formed in a process similar to that described for memory stack 450 in FIGS. 4A-H.

Figure 10B:
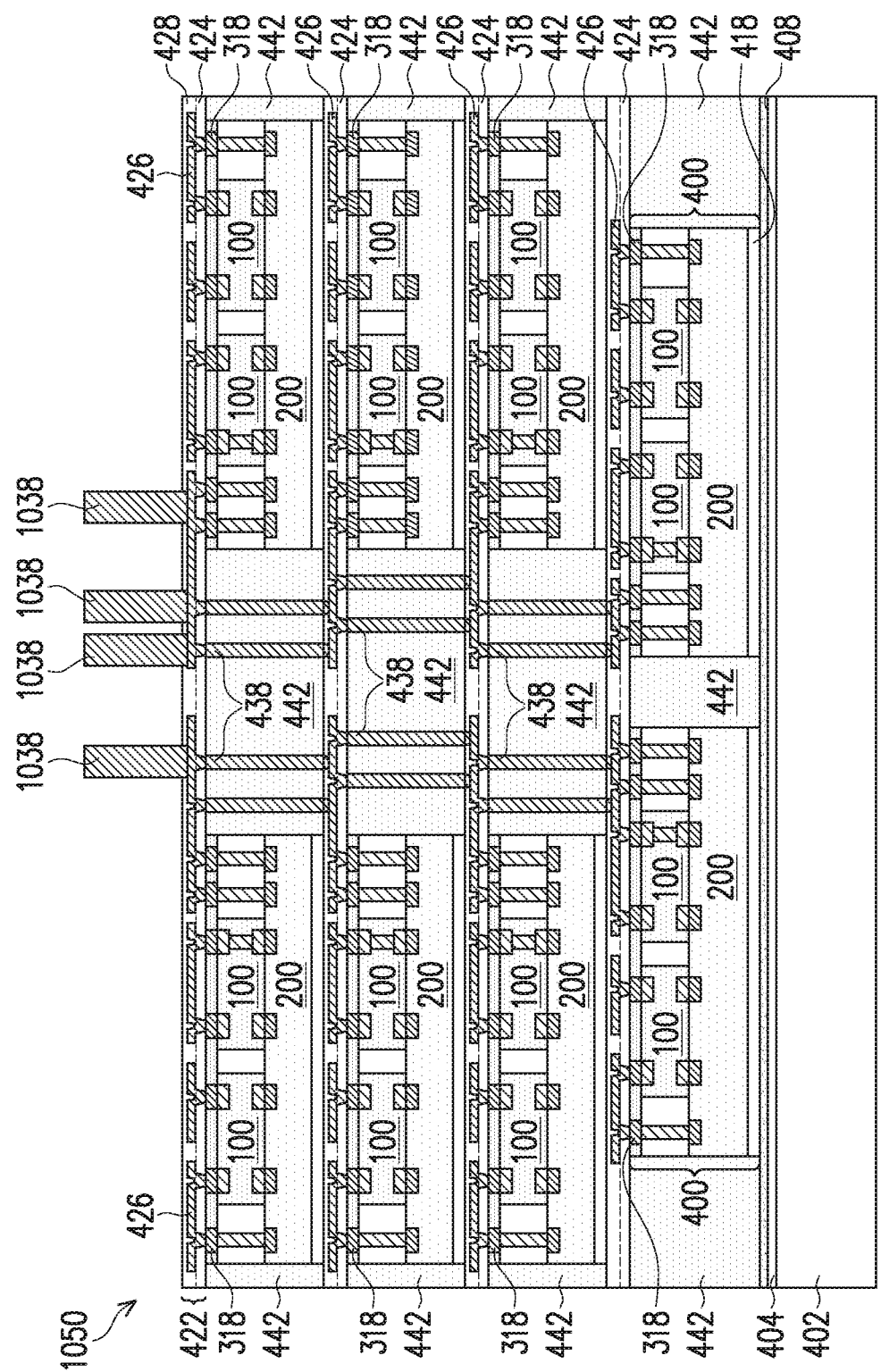

In FIG. 10B, conductive pillars 1038 are formed, in accordance with some embodiments. Conductive pillars 1038 are electrically connected to the topmost redistribution structure 422 of memory stack 1050, and thus may be electrically connected to memory structures within memory stack 1050. The topmost dielectric layer of redistribution structure 422 (e.g., dielectric layer 428) may first be patterned to form openings exposing portions of the topmost metallization pattern of redistribution structure 422 (e.g., metallization pattern 426). The patterning may be performed using an acceptable process, such as by exposing the dielectric layer 426 to light when the dielectric layer 426 is a photo-sensitive material or by etching using, for example, an anisotropic etch.

As an example to form conductive pillars 1038, a seed layer (not shown) may be formed over the topmost redistribution structure 422, e.g., on dielectric layer 428 and exposed portions of metallization pattern 426. In some embodiments, the seed layer is a metal layer, which may be a single layer or a composite layer comprising a plurality of sub-layers formed of different materials. In a particular embodiment, the seed layer comprises a titanium layer and a copper layer over the titanium layer. The seed layer may be formed using, for example, PVD or the like. A photoresist may then be formed and patterned on the seed layer. The photoresist may be formed by spin coating or the like and may be exposed to light for patterning. The patterning forms openings through the photoresist to expose the seed layer. A conductive material is formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. The photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching. The remaining portions of the seed layer and conductive material form conductive pillars 1038. Four conductive pillars 1038 are shown in FIG. 10B, but more or fewer conductive pillars 1038 may be formed in other embodiments. In some cases, the conductive pillars 1038 may be considered through vias, such as through-insulation vias (TIVs).

Figure 10C:
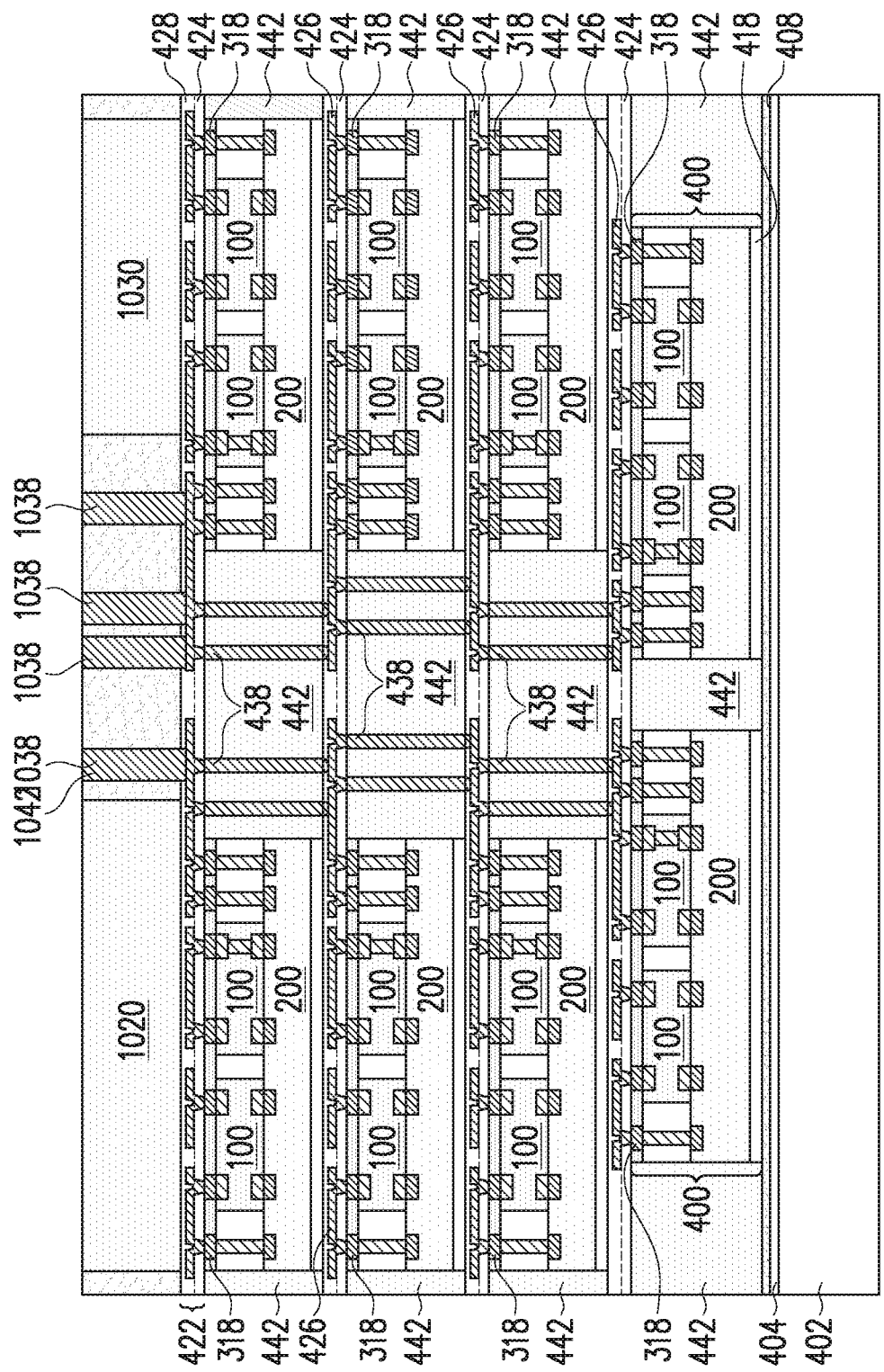

In FIG. 10C, logic devices 1020 and 1030 are attached to the memory stack 1050 (e.g., to the topmost redistribution structure 422), in accordance with some embodiments. Logic devices 1020 and/or 1030 may be a device similar to those described above with respect to logic device 520 (see FIG. 5A) or may be a device similar to those described above with respect to device 920 (see FIG. 9). Logic device 1020 may be similar to or different from logic device 1030, and more than two logic devices may be attached in other embodiments. Logic devices 1020 and 1030 may be attached to the memory stack 1050 using a DAF or the like (not shown), in accordance with some embodiments. In some embodiments, logic device 1020 or 1030 does not include through vias, as shown in FIG. 10C. In other embodiments, logic device 1020 or 1030 may include through vias, similar to logic device 520 shown in FIG. 5A.

After attaching logic devices 1020 and 1030, an encapsulant 1042 is formed on and around the logic devices 1020 and 1030 and conductive pillars 1038. The encapsulant 1042 may be similar to, for example, the encapsulant 442 described previously in FIG. 4C. After forming encapsulant 1042, a planarization process (e.g., a CMP process) may be performed to remove excess encapsulant 1042. In some embodiments, the planarization process may expose conductive pillars 1038, and may expose contact pads or other conductive features (not shown) of the logic devices 1020 and 1030.

Figure 10D:
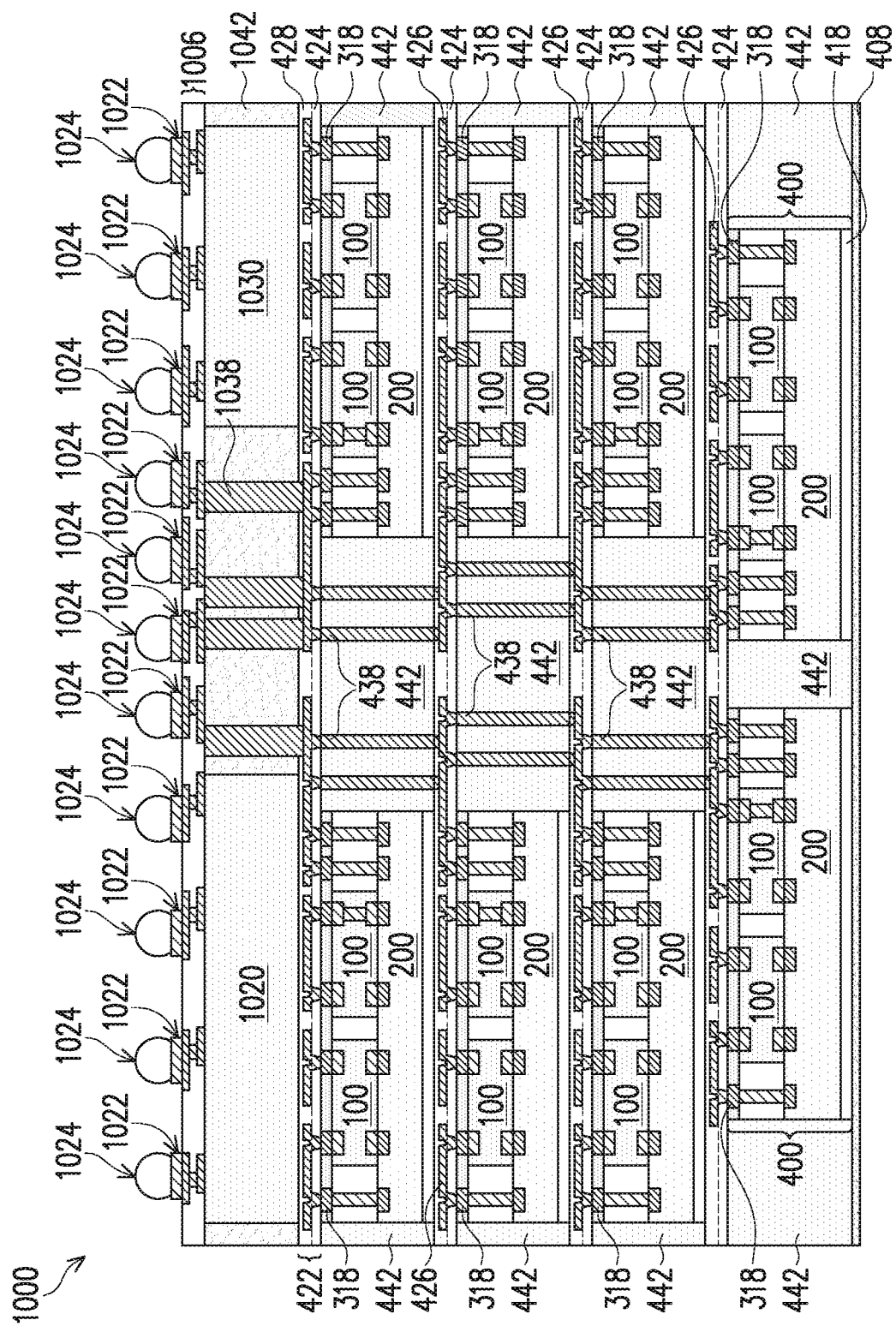

Turning to FIG. 10D, an interconnect structure 1006 is formed over logic devices 1020 and 1030 and external connectors 1026 are formed on the interconnect structure 1006 to form a memory package 1000, in accordance with some embodiments. Interconnect structure 1006 is formed over logic devices 1020 and 1030, conductive pillars 1038, and encapsulant 1042, and is used to electrically connect logic devices 1020 and 1030 to each other and/or to memory stack 1050 (through conductive pillars 1038). In some embodiments, interconnect structure 1006 may be similar to interconnect structure 506 (see FIG. 5A) and formed in a similar manner, or the interconnect structure 1006 may be similar to redistribution structure 422 (see FIG. 4D) and formed in a similar manner. For example, interconnect structure 1006 may include one or more dielectric layers and respective metallization patterns in the dielectric layers that may include vias and/or traces.

Still referring to FIG. 10D, UBMs 1022 may be formed for external connection to interconnect structure 1006. UBMs 1022 have bump portions on and extending along the major surface of interconnect structure 1006, and may have via portions. External connectors 1024 are formed on the UBMs 1022. External connectors 1024 may be BGA connectors, solder balls, metal pillars, C4 bumps, micro bumps, ENEPIG formed bumps, or the like. External connectors 1024 may include a conductive material such as solder, copper, aluminum, gold, nickel, silver, palladium, tin, the like, or a combination thereof. In some embodiments, external connectors 1024 are formed by initially forming a layer of solder through evaporation, electroplating, printing, solder transfer, ball placement, or the like. Once a layer of solder has been formed on the structure, a reflow may be performed in order to shape the material into the desired bump shapes. In another embodiment, external connectors 1024 comprise metal pillars (such as a copper pillar) formed by a sputtering, printing, electro plating, electroless plating, CVD, or the like. The metal pillars may be solder free and have substantially vertical sidewalls. In some embodiments, a metal cap layer is formed on the top of the metal pillars. The metal cap layer may include nickel, tin, tin-lead, gold, silver, palladium, indium, nickel-palladium-gold, nickel-gold, the like, or a combination thereof, and may be formed by a plating process. After forming external connectors 1024, memory package 1000 may be singulated and/or carrier substrate 402 may be de-bonded using techniques described previously.

As shown in FIGS. 10A-D, a memory package 1000 is formed that includes multiple logic devices 1020 and 1030. The logic devices 1020 and 1030 are attached to the memory stack 1050 rather than the memory stack 1050 being bonded to the logic devices 1020 and 1030 using e.g., solder bumps. Forming a memory package in this manner may reduce the number of process steps or the cost of processing. Additionally, the functionality of different logic devices may be combined in a single memory package, allowing for more flexibility in design.

Figure 11A:
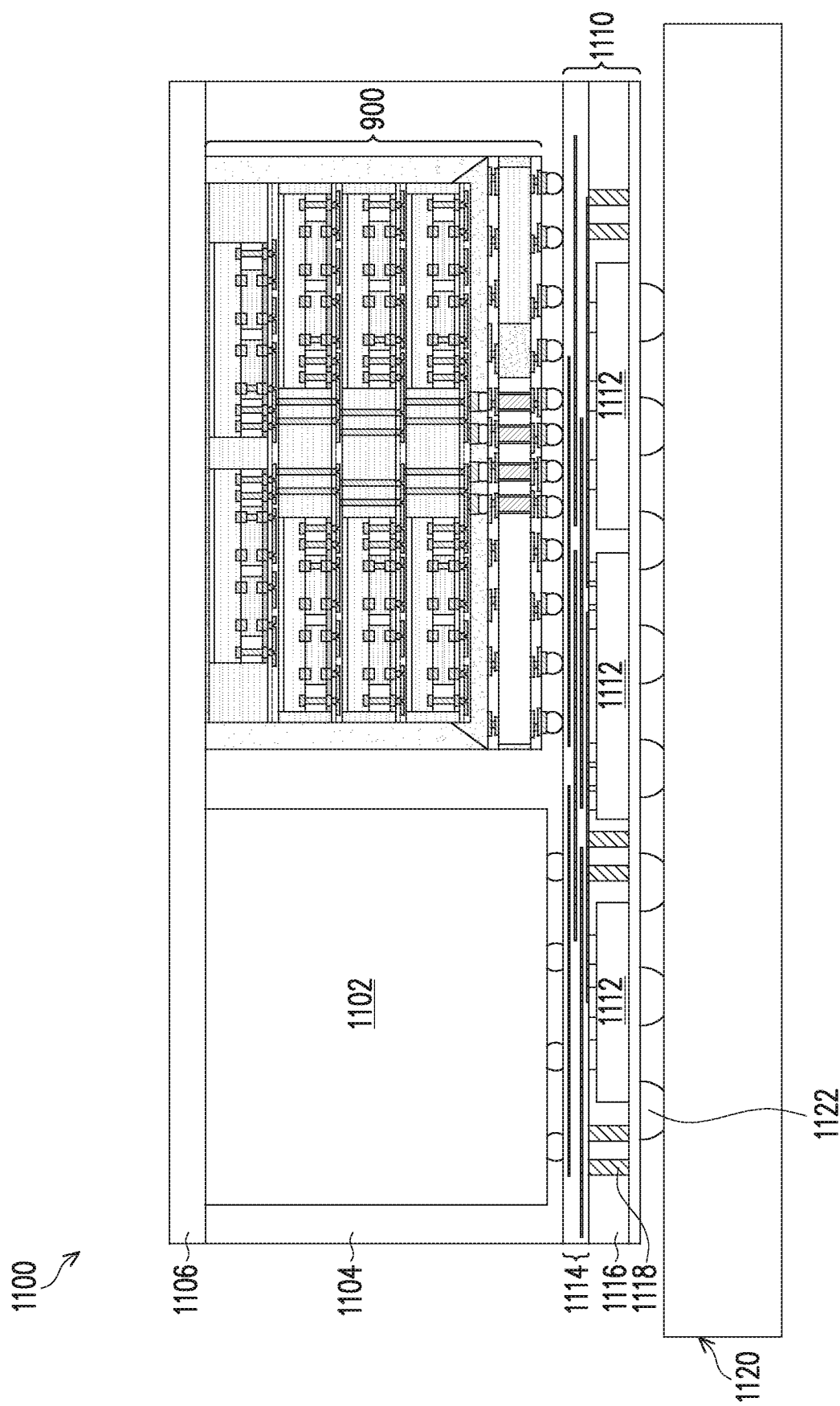
FIGS. 11A and 11B illustrate package structures incorporating memory packages, in accordance with some embodiments.
Figure 11B:
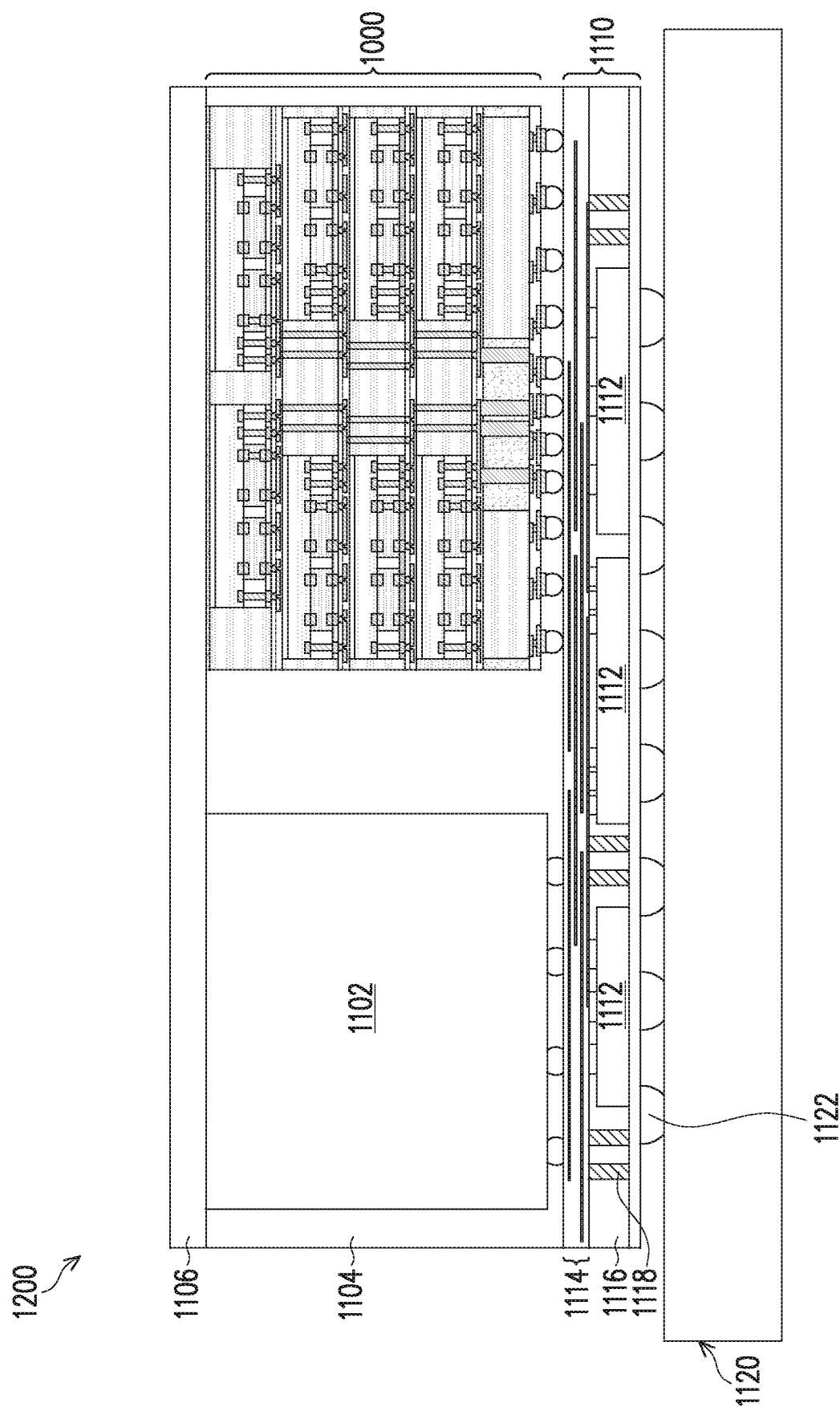

FIGS. 11A and 11B illustrate package structures 1100 and 1200, in accordance with some embodiments. The package structures 1100 and 1200 are illustrative examples of package structures that incorporate the memory packages described in the present disclosure. For example, package structure 1100 incorporates the memory package 900 shown in FIG. 9, and package structure 1200 incorporates the memory package 1000 shown in FIG. 10D. Other memory packages may be used in other package structures, and other configurations of package structures and/or memory packages are possible.

As shown in FIGS. 11A and 11B, the memory package 900/1000 of the package structures 1100/1200 may be attached to an interposer substrate 1110. One or more device dies 1102 may also be attached to the interposer substrate 1110. The device die 1102 may include a logic die, which may be a Central Processing Unit (CPU) die, a Micro Control Unit (MCU) die, an input-output (I/O) die, a Base-Band (BB) die, an Application processor (AP) die, the like, or a combination. An encapsulant 1104 may be formed surrounding the device die 1102 and the memory package 900/1000.

Optionally, a heat spreader 1106 may be formed over the device die 1102 and memory package 900/1000. The heat spreader 1106 may be formed from a material with high thermal conductivity, such as steel, stainless steel, copper, the like, or combinations thereof. The heat spreader 1106 protects the package structures 1100/1200 and forms a thermal pathway to conduct heat from the various components of the package structures 1100/1200.

The interposer substrate 1110 may be made of a semiconductor material such as silicon, germanium, glass, or the like. Alternatively, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. Additionally, the interposer substrate 1110 may be a SOI substrate, which may include a layer of a semiconductor material such as epitaxial silicon, germanium, silicon germanium, SOI, or combinations thereof. The interposer substrate 1110 is, in one alternative embodiment, based on an insulating core such as a fiberglass reinforced resin core.

The interposer substrate 1110 may include an interconnect structure 1114, to which the device die 1102 and memory package 900/1000 may be connected. The interconnect structure 1114 may include metallization layers and vias, and may include bond pads over the metallization layers and vias. The metallization layers may be designed to connect the various devices of the package structure 1100/1200 to form functional circuitry, and may be redistribution layers. The metallization layers may be formed of alternating layers of dielectric (e.g., low-k dielectric material) and conductive material (e.g., copper) with vias interconnecting the layers of conductive material and may be formed through any suitable process (such as deposition, damascene, dual damascene, or the like).

The interposer substrate 1110 may include active and/or passive devices, shown as devices 1112 in FIGS. 11A and 11B. As one of ordinary skill in the art will recognize, a wide variety of devices such as transistors, capacitors, resistors, combinations of these, and the like may be used to generate the structural and functional requirements of the package structure 1100/1200. For example, one or more of the devices 1112 may be an Integrated Passive Device (IPD), a voltage regulator chip, or the like. The devices 1112 may include deep trench capacitors, metal-insulator-metal capacitors, inductors, resistors, BEOL, metal lines, the like, or a combination thereof. The devices 1112 may be formed using any suitable methods. The devices 1112 may be electrically connected to the interconnect structure 1114. In some embodiments, the package substrate 1100 is substantially free of active and passive devices.

In some embodiments, the interposer substrate 1110 may include through vias 1118 that electrically connect the interconnect structure 1114 to conductive features on the opposite side of the interposer substrate 1110, such as an additional interconnect structure, additional metallization layers, or the like. An encapsulant 1116 may be formed surrounding the through vias 1118 and the devices 1112. The package structure 1100/1200 may be attached to an external component 1120 by conductive connectors 1122, which may be solder balls or the like. The conductive connectors 1122 may be electrically connected to the interconnect structure 1114 by through vias 1118, in some embodiments.

In above-illustrated embodiments, some processes and features are discussed in accordance with some embodiments of the present disclosure to form a three-dimensional (3D) package. Other features and processes may also be included. For example, testing structures may be included to aid in the verification testing of the 3D packaging or 3DIC devices. The testing structures may include, for example, test pads formed in a redistribution layer, in an interconnect structure, or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

The embodiments of the present disclosure have some advantageous features. By forming memory devices and peripheral devices on separate substrates and bonding them together to form a memory structure, the routing distance between the components of the memory devices and the circuitry of the associated peripheral devices can be reduced. By reducing the routing distance, the latency of the memory structures can be reduced. This can improve high-speed operation of a memory stack or a memory package formed using the memory structures. Additionally, the memory device and the peripheral device may be formed using different technologies, and thus the design or manufacture technology of each type of device can be optimized or adapted for a particular application, which can further improve the operation of the memory structure. The memory structures can include multiple peripheral devices or other types of devices in different combinations, which allows for more flexible designs.

In accordance with some embodiments of the present disclosure, a method includes forming a first set of memory structures and a second set of memory structures, wherein forming each memory structure of the first set of memory structures and the second set of memory structures includes forming a first device comprising memory components on a first substrate, forming a second device on a second substrate, and bonding the second device to the first device to electrically couple the first device to the second device, forming a stack of memory structures, including placing the first set of memory structures on a carrier, forming a first redistribution structure on and electrically connected to the first set of memory structures, forming a first set of through vias on and electrically connected to the first redistribution structure; and placing the second set of memory structures on the first redistribution structure, and attaching the stack of memory structures to a logic die. In an embodiment, bonding the first device to the second device including a hybrid bonding process. In an embodiment, forming each memory structure of the first set of memory structures and the second set of memory structures further includes, after bonding the first device to the second device, forming a dielectric material on the first device and surrounding the second device and forming at least one through dielectric via extending through the dielectric material, wherein the at least one through dielectric via is electrically connected to the first device. In an embodiment, forming each memory structure of the first set of memory structures and the second set of memory structures further includes forming a third device on a third substrate, and bonding the third device to the first device to electrically couple the third device to the first device. In an embodiment, the third device includes an integrated passive device (IPD). In an embodiment, the first device has the same lateral dimensions as the second device. In an embodiment, forming the stack of memory structures further includes forming a second redistribution structure on and electrically connected to the second set of memory structures and the first set of through vias, and forming a second set of through vias on and electrically connected to the second redistribution structure. In an embodiment, the memory components of the first device include DRAM components. In an embodiment, the first device is formed using a DRAM process technology and the second device is formed using a CMOS process technology.

In accordance with some embodiments of the present disclosure, a method includes forming a stacked memory device, including placing a first memory structure on a carrier substrate, the first memory structure including a first memory die bonded to a first logic die, forming a first redistribution structure on the first memory structure, wherein the first redistribution structure is electrically connected to the first memory structure, forming first metal pillars extending from the first redistribution structure, wherein the first metal pillars are electrically connected to the first redistribution structure, placing a second memory structure on the first redistribution structure adjacent the first metal pillars, the second memory structure including a second memory die bonded to a second logic die, forming a second redistribution structure over the second memory structure and the first metal pillars, wherein the second redistribution structure is electrically connected to the first metal pillars, and forming external connectors on the second redistribution structure, wherein the external connectors are electrically connected to the second redistribution structure, and attaching the stacked memory device to a third logic die, wherein the external connectors of the stacked memory device are electrically connected to the third logic die. In an embodiment, the method further includes forming the first memory structure, including bonding a front surface of the first logic die to a front surface of the first memory die, and forming a dielectric material on the front surface of the first memory die, forming a through via extending through the dielectric material, wherein the through via is electrically connected to the first memory die. In an embodiment, the method further includes forming the second memory structure, including bonding a front surface of the second logic die to a front surface of the second memory die, forming a dielectric material on the front surface of the second logic die, and forming a through via extending through the dielectric material, wherein the through via is electrically connected to the second logic die. In an embodiment, the third logic die includes through substrate vias, and wherein the external connectors of the stacked memory device are attached to the through substrate vias. In an embodiment, forming a stacked memory device further includes forming an encapsulant over and surrounding the first metal pillars and the first memory structure. In an embodiment, the method further includes placing a third memory structure on the carrier substrate.

In accordance with some embodiments of the present disclosure, a package includes a memory stack attached to a logic device, the memory stack including first memory structures, a first redistribution layer over and electrically connected to the first memory structures, second memory structures on the first redistribution layer, a second redistribution layer over and electrically connected to the second memory structures, and first metal pillars on the first redistribution layer and adjacent the second memory structures, the first metal pillars electrically connecting the first redistribution layer and the second redistribution layer, wherein each first memory structure of the first memory structures includes a memory die comprising first contact pads and a peripheral circuitry die comprising second contact pads, wherein the first contact pads of the memory die are bonded to the second contact pads of the peripheral circuitry die. In an embodiment, the memory die is an MRAM memory die. In an embodiment, the peripheral circuitry die has a lateral area that is smaller than the lateral area of the memory die. In an embodiment, each first memory structure of the first memory structures further includes a dielectric material surrounding the peripheral circuitry die and a Through-Dielectric Via (TDV) extending through the dielectric material to contact a first contact pad of the memory die. In an embodiment, the first metal pillars and the second memory structures are surrounded by and separated by a molding material.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package comprising:
    a memory stack attached to a logic device, the memory stack comprising:
        a plurality of first memory structures;
        a first redistribution layer over and electrically connected to the plurality of first memory structures;
        a plurality of second memory structures on the first redistribution layer;
        a second redistribution layer over and electrically connected to the plurality of second memory structures; and
        a plurality of first metal pillars on the first redistribution layer and adjacent the plurality of second memory structures, the plurality of first metal pillars electrically connecting the first redistribution layer and the second redistribution layer;
    wherein each first memory structure of the plurality of first memory structures comprises:
        a memory die comprising first contact pads; and
        a peripheral circuitry die comprising second contact pads, wherein the first contact pads of the memory die are bonded to the second contact pads of the peripheral circuitry die.

2. The package of claim 1, wherein the memory die is an MRAM memory die.

3. The package of claim 1, wherein the peripheral circuitry die has a lateral area that is smaller than a lateral area of the memory die.

4. The package of claim 1, wherein each first memory structure of the plurality of first memory structures further comprises a dielectric material surrounding the peripheral circuitry die and a Through-Dielectric Via (TDV) extending through the dielectric material to contact a first contact pad of the memory die.

5. The package of claim 1, wherein the plurality of first metal pillars and the plurality of second memory structures are surrounded by and separated by a molding material.

6. The package of claim 1, wherein the logic device has a greater lateral width than the memory stack.

7. The package of claim 6, further comprising a molding material on the logic device, wherein the molding material extends along sidewalls of the memory stack.

8. A package comprising:
    a first redistribution layer;

a first memory structure electrically bonded to the first redistribution layer, wherein the first memory structure comprises:
- a first memory die comprising first contact pads; and
- a first peripheral circuitry die comprising second contact pads, wherein the first contact pads of the first memory die are bonded to the second contact pads of the first peripheral circuitry die;

a logic device bonded to the first redistribution layer, wherein the logic device and the first memory structure are bonded to opposing sides of the first redistribution layer; and an underfill between the logic device and the first redistribution layer, wherein the underfill contacts a sidewall of the first redistribution layer.

9. The package of claim 8, further comprising a first molding compound over the first redistribution layer and along sidewalls of the first memory structure.

10. The package of claim 9, further comprising a second molding compound over the logic device and along sidewalls of the first molding compound.

11. The package of claim 8, wherein the first memory die and the first peripheral circuitry die have different widths.

12. The package of claim 8, wherein an active side of the logic device faces away from the first redistribution layer and the first memory structure.

13. The package of claim 9 further comprising a first through via extending through the first molding compound.

14. The package of claim 13, further comprising:
- a second redistribution layer over the first memory structure; and
- a second memory structure electrically bonded to the second redistribution layer, wherein the second memory structure comprises:
  - a second memory die comprising third contact pads; and
  - a second peripheral circuitry die comprising fourth contact pads, wherein the third contact pads of the second memory die are bonded to the fourth contact pads of the second peripheral circuitry die.

15. The package of claim 14, wherein the second memory structure is laterally over the first through via.

16. A package comprising:
- a logic die;
- a first redistribution structure bonded to the logic die;
- a first set of memory structures on and electrically coupled to the first redistribution structure;
- a first molding compound on the first redistribution structure, the first molding compound extending along sidewalls of the first set of memory structures;
- a first through via extending through the first molding compound;
- a second redistribution structure;
- a second set of memory structures on and electrically coupled to the second redistribution structure, the first through via electrically coupling the first redistribution structure to the second redistribution structure, wherein a first memory structure of the second set of memory structures is laterally over the first through via; and
- a second molding compound on the second redistribution structure, the second molding compound extending along sidewalls of the second set of memory structures.

17. The package of claim 16, wherein the first redistribution structure is bonded to a backside of the logic die.

18. The package of claim 16, wherein the first through via is between adjacent ones of the first set of memory structures.

19. The package of claim 16, further comprising a third molding compound over the logic die, the third molding compound extending along sidewalls or the first molding compound, the second molding compound, and the second redistribution structure.

20. The package of claim 16, further comprising an underfill between the logic die and the first redistribution structure, wherein the underfill extends along a sidewall of the first redistribution structure.

* * * * *